US012777613B2

(12) United States Patent
Shelnutt

(10) Patent No.: US 12,777,613 B2
(45) Date of Patent: Oct. 27, 2026

(54) DISTRIBUTED IMPINGEMENT AND RECOVERY MANIFOLD (DIRM) COLD PLATE

(71) Applicant: STRATEGIC THERMAL LABS, LLC, Georgetown, TX (US)

(72) Inventor: Austin Michael Shelnutt, Georgetown, TX (US)

(73) Assignee: Strategic Thermal Labs, LLC, Georgetown, TX (US)

( * ) Notice: Subject to any disclaimer, the term of this patent is extended or adjusted under 35 U.S.C. 154(b) by 295 days.

(21) Appl. No.: 18/404,683

(22) Filed: Jan. 4, 2024

(65) Prior Publication Data

US 2025/0227891 A1 Jul. 10, 2025

(51) Int. Cl.
*H05K 7/20* (2006.01)
*H10W 40/40* (2026.01)
*H10W 40/47* (2026.01)

(52) U.S. Cl.
CPC ...... *H05K 7/20254* (2013.01); *H10W 40/475* (2026.01)

(58) Field of Classification Search
None
See application file for complete search history.

(56) References Cited

U.S. PATENT DOCUMENTS 5,249,358 A 10/1993 Tousignant et al.
5,269,372 A 12/1993 Chu et al.
11,849,569 B2 * 12/2023 Zhou .................. H05K 7/20254
12,185,511 B2 * 12/2024 Joshi .......................... F28F 3/12
12,274,026 B2 * 4/2025 Hazra ................ H05K 7/20809
12,356,584 B2 * 7/2025 Heydari ............. H05K 7/20781
2014/0284029 A1 9/2014 Yoshida
2017/0295677 A1 * 10/2017 Shelnutt ............. H05K 7/20836
2020/0084913 A1 * 3/2020 Jia ........................... F28D 1/035
2020/0227341 A1 * 7/2020 Neal ......................... F28F 3/12
2020/0296858 A1 * 9/2020 Matsumura ........... H01L 23/473
2021/0320048 A1 * 10/2021 Limaye ............... H01L 25/0655
2022/0210953 A1 * 6/2022 Gao ................... H05K 7/20254

(Continued)

OTHER PUBLICATIONS

International Search Report, Patent Cooperation Treaty, International Application No. PCT/US2024/010361, Apr. 12, 2024; 2 pages.

(Continued)

*Primary Examiner* — Courtney L Smith
(74) *Attorney, Agent, or Firm* — Isidore PLLC

(57) ABSTRACT

A cold plate assembly includes a cold plate having first surface attachable to heat generating electronic component (s) and opposite second surface enclosed by an encapsulating lid that has inlet and exhaust ports. A distributed impingement and recovery manifold (DIRM) is positioned above the second surface of the cold plate. The DIRM includes an intake manifold presenting at least one sequence of nozzle openings providing direct impingement of cooling liquid on corresponding sections of the second surface and a return manifold which facilitates a return of exhaust cooling liquid to the exhaust port following at least one direct impingement of the portion of cooling liquid onto the corresponding sections to provide distributed, localized impingement cooling at corresponding sections of the cold plate.

35 Claims, 29 Drawing Sheets

(56) References Cited

U.S. PATENT DOCUMENTS

| | | | | |
|---|---|---|---|---|
| 2023/0096875 | A1 * | 3/2023 | Edmunds | H05K 7/20772 361/689 |
| 2023/0200011 | A1 | 6/2023 | Sathyamurthy et al. | |
| 2023/0225082 | A1 * | 7/2023 | Zhang | G06F 1/20 361/700 |
| 2023/0332839 | A1 * | 10/2023 | Megaridis | F28D 15/04 |

OTHER PUBLICATIONS

Written Opinion of the International Searching Authority, International Application No. PCT/US2024/010361, Apr. 12, 2024; 9 pages.

* cited by examiner

DISTRIBUTED IMPINGEMENT AND RECOVERY MANIFOLD (DIRM) COLD PLATE

BACKGROUND

1. Technical Field

The present application relates generally to heat transfer mechanisms used for cooling electronic devices, and more particularly, to liquid cooling apparatuses for removing heat generated by one or more electronic devices.

2. Description of the Related Art

Recent trends in global digital transformation have created incredible demand for increased processing performance in colocation and edge deployments of data/information processing servers. Datacenters today rely upon high power microprocessor devices, such as central processors (CPUs) and graphic processing units (GPUs), which generate a high level of heat in a small area. Traditional use of air as the heat transfer medium to cool heat dissipating components is unable to meet the thermal dissipation requirement of these high-power microprocessor devices. Thus, liquid cooling using cold plates have become a preferred way to provide the required cooling. Cold plates are a type of heatsink that allows for a cooling liquid to be brought into thermal conduction contact with the heat generating electronic components of servers and other information processing systems. These cold plates rely upon ultra-narrow fluid passages called “microchannels” to dissipate heat from the processors into the cooling liquid.

One challenge of constructing cold plates is that, unlike air-cooled heatsinks, cooling liquids have extremely high heat transfer coefficients that create diminished returns on fin height (commonly referred to as fin efficiency) because it is difficult to conduct heat through narrow passages using conventional metals. Fin efficiency limits typically result in cold plate fin heights that are less than 4 mm. This means that cold plates are effectively a two-dimensional heat sink.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
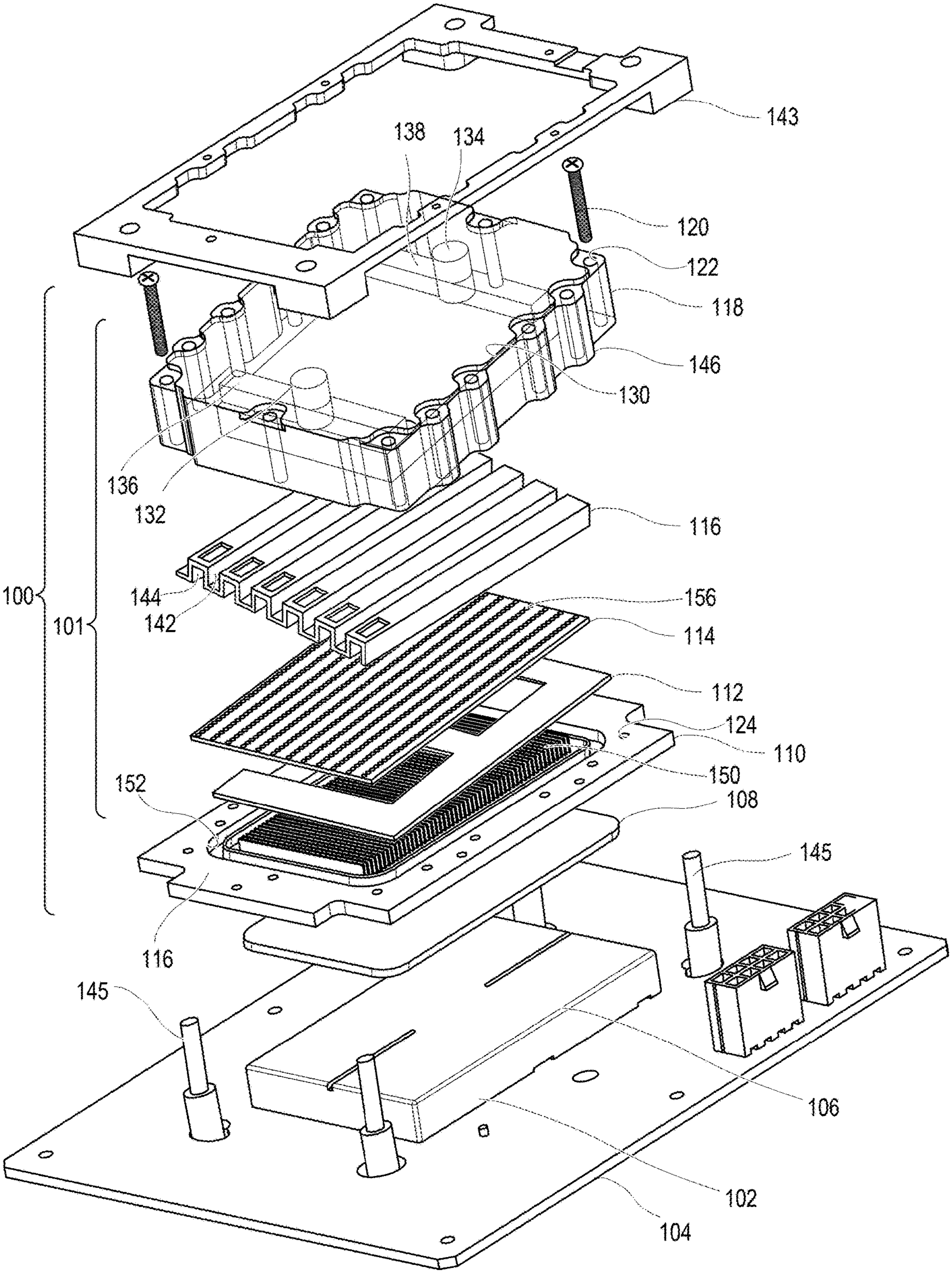
FIG. 1 presents a three-dimensional disassembled view of an example cold plate assembly having a first distribution and return manifold that is configured to provide localized liquid cooling to and a heat generating electronic component, according to one or more embodiments.

Disclosed are different embodiments of a cold plate assembly, methods of manufacturing the cold plate assembly, and an information processing system and a data center that includes the cold plate assembly, which provides direct impingement of a cooling liquid onto a surface of a cold plate to provide more efficient heat transfer from the cold plate. According to one or more embodiments, the cold plate assembly includes a cold plate comprised of a thermally conductive material and having a first surface attachable to a heat generating electronic component and a second surface opposite to the first surface and having an array of fins that facilitate heat transfer from the attached heat generating electronic component via a cooling liquid flow. The cold plate assembly also includes an encapsulating lid attachable to the second surface to form a liquid cooling cavity and comprising: (i) an intake port for receiving cooling liquid flow from a cooling liquid source; and (ii) an exhaust port for expelling exhaust cooling liquid provided from impingements of the received cooling liquid on the second surface of the cold plate. The cold plate assembly further includes a distributed impingement and recovery manifold (DIRM) positioned within the liquid cooling cavity of the encapsulating lid above the second surface of the cold plate, the DIRM comprising (i) an intake manifold presenting at least one sequence of nozzle openings in fluid communication with the intake port, each nozzle opening providing direct impingement of a portion of cooling liquid on at least one corresponding section of the second surface and (ii) a return manifold in fluid communication with the exhaust port and which facilitates a return of exhaust cooling liquid to the exhaust port following at least one direct impingement of the portion of cooling liquid onto the at least one corresponding section to provide distributed, localized impingement cooling at corresponding sections of the cold plate.

According to a first aspect of the present disclosure, an encapsulated heatsink ("a cold plate assembly") is configured for cooling heat generating electronic components with liquid coolant. In one or more embodiments, a cold plate of the cold plate assembly has a conductive substrate with extended fin features of narrow hydraulic diameter ("microchannels") that is more efficiently liquid cooled with a multi-layer manifold solution. Jet impingement nozzles create high velocity and high heat transfer coefficient convection flows on heated surfaces in a localized portion of the cold plate. The multi-layer manifold solution provides a plurality of supply and return jet impingement pairs across the entire surface of the cold plate and provides distributed recovery of the high velocity supply flow to ensure that cooling liquid is impinged upon the entire heated surface. The liquid-cooled cold plate assembly leverages a multi-layer distribution manifold design that provides a plurality of supply coolant jets (nozzles) and proximate/adjacent return coolant ports across the heated surfaces of a cold plate of the cold plate assembly. The supply coolant jets impinge upon the surface creating high heat transfer coefficients and the adjacent return ports gather up the heated fluid to prevent the buildup of a thermal boundary layer along the flow path.

In one or more embodiments, the cold plate assembly includes a cold plate made of a thermally conductive material and having a first surface attachable to a heat generating electronic component. The cold plate has a second surface opposite to the first surface facilitating heat transfer from the attached heat generating electronic component via a cooling liquid flow. The cold plate assembly includes an encapsulating lid attachable to the second surface to form a liquid cooling cavity. The second surface has an array of fins that facilitate heat transfer from the attached heat generating electronic component via a cooling liquid flow. An encapsulating lid is attachable to the second surface to form a liquid cooling cavity. The encapsulating lid includes an intake port and an exhaust port. The intake port receives cooling liquid flow from a cooling liquid source. The exhaust port for expelling exhaust cooling liquid provided from impingements of the received cooling liquid on the second surface of the cold plate. A distributed impingement and recovery manifold (DIRM) is positioned within the liquid cooling cavity of the encapsulating lid above the second surface of the cold plate. The DIRM includes an intake manifold presenting at least one sequence of nozzle openings in fluid communication with the intake port. Each nozzle opening provides direct impingement of a portion of cooling liquid on at least one corresponding section of the second surface. The DIRM includes a return manifold in fluid communication with the exhaust port and which facilitates a return of exhaust cooling liquid to the exhaust port following at least one direct impingement of the portion of cooling liquid onto the at least one corresponding section to provide distributed, localized impingement cooling at corresponding sections of the cold plate.

According to a second aspect of the disclosure, and in accordance with one or more embodiments, the DIRM of the cold plate assembly includes a nozzle plate positioned as a first layer proximate and parallel to the second surface and having a plurality of through holes configured to create respective jets of cooling liquid that impinge the second surface. The cold plate assembly includes a return port plate positioned as a second layer stacked on the nozzle plate and having more than one supply flow paths that channel supply liquid from the intake port to a first subset of the plurality of through holes in the nozzle plate that function as nozzle orifices. The return port plate also has one or more return flow paths, adjacent to a respective supply flow path, that channels exhaust liquid from a second subset of the plurality of through holes that function as return orifices to the exhaust port, the second subset of through holes being exclusive of the first subset. One or more nozzle orifices are located proximate to one or more return orifices, creating localized cooling flow paths with localized recovery of the cooling liquid that disrupt a thermal boundary layer at the second surface of the cold plate. In one or more embodiments, the cold plate assembly includes a restrictor plate positionable between the second surface of the cold plate and the nozzle plate to block a third subset of the nozzle through holes that are not required to liquid cool the heat generating electronic component, while leaving respective portions of the first subset and the second subset of the plurality of nozzle through holes unblocked for selective impingement of the cooling liquid on higher heat emitting surface areas of the heat generating electronic component. The restrictor plate provides localized enhancement to promote higher coolant flow rates on specific regions of the cold plate surface where heat flux is known to be greater for cold plates (or adjacent heat generating electronic component) with non-uniform surface heat distributions.

According to a third aspect of the present disclosure, and in accordance with one or more embodiments, the DIRM of the cold plate assembly includes a nozzle plate positioned as a first layer proximate and parallel to the second surface and having a plurality of through holes. The cold plate assembly includes a supply manifold system sealably connected for liquid transfer from the intake port to a first subset of the through holes ("nozzle orifices") in the nozzle plate configured to create a corresponding plurality of nozzle jets that impinges at least a portion of the array of extended fins. The cold plate assembly includes a return manifold system sealably connected for liquid transfer to the exhaust port from a second subset of the plurality of through holes, exclusive of and alternating with, the first subset of the plurality of through holes to create a localized liquid flow path that disrupt a thermal boundary layer at the second surface of the cold plate.

According to a fourth aspect of the present disclosure, and in accordance with one or more embodiments, the DIRM of the cold plate assembly has an intake manifold including a top plate that extends over the array of extended fins and having a first sequence of nozzle openings presenting a single nozzle opening above each microchannel of the plurality of microchannels. The single nozzle opening presents a jet of cooling liquid impinging a first section of the second surface along a corresponding microchannel. The DIRM includes an arrangement of alternating upper and lower baffles extending beneath the top plate and positioned laterally inside each microchannel to cause alternating upwards and downwards flow of the cooling liquid impinging at the first section within the microchannel. Each downwards flow causes the cooling liquid to impinge a next section of the second surface within the microchannel. Each impingement of the cooling liquid on sections of the microchannel results in an increased liquid heat transfer coefficient at the second surface. The DIRM includes a bifurcated return manifold having a first and a second return channel at opposed ends of the microchannels along the array of extended fins for collecting and channeling the exhaust cooling liquid flow flowing from each microchannel towards the exhaust port.

According to a fifth aspect of the present disclosure, an information processing system includes at least one heat generating electronic component and the above introduced cold plate assembly thermally attached/connected to the at least one heat generating electronic component to provide liquid cooling. In a fourth aspect of the present disclosure, a data center includes an information processing system rack having an information processing system that includes at least one heat generating electronic component and the above-introduced cold plate assembly thermally attached/connected to the at least one heat generating electronic component to provide liquid cooling.

Future central processing units (CPUs) and application specific integrated circuits (ASICs) are pushing past the current boundaries of heat generation during information processing within an information processing system. While liquid cooling is the preferred method for addressing the high thermal yields of these devices, the standard fin geometries of conventional cold plates have a limited surface area in a relative 2-dimensional (2D) space and thus cannot provide sufficient cooling for these devices as the devices increase their thermal output. Creating larger surface area on a conventional 2D cold plate, geometrically requires creating ever smaller and smaller fin spacings. Current technology allows manufacturers to create 0.2-0.4 mm channels which, while ideal for 2D heat transfer, are very intolerant of debris, particles, and corrosion agents within the cooling liquid, necessitating specialized water quality control via secondary coolant loop (i.e., technology cooling system (TCS)). The limits of these conventional systems have been reached. The present disclosure addresses and overcomes these limitations in existing cold plate technology by providing a multi-layer manifold solution of localized and distributed supply and return jet impingement pairs across the entire surface of the cold plate that disrupt a thermal boundary layer at a surface of the cold plate. Additionally, the present disclosure provides more efficient heat absorption and thermal dissipation from the attached heat generating electronic component by providing phase change heat transfer using a saturated working fluid within a phase change cavity ("vapor chamber") placed between the heat generating electronic component and the bottom surface of the attached cold plate. Alternatively, or in addition, the cold plate incorporates a vapor chamber. Accordingly, the cold plate assembly provides a more efficient heat exchange mechanism for use within a liquid cooling loop of a datacenter facility or other operating environment.

The present disclosure also overcomes deficiencies in the existing liquid cooling solutions caused by the sensitive nature of the convention cold plates, which are susceptible to corrosion and clogging if exposed to a flow of regular liquid. Specifically, one aspect of the present disclosure provides a cold plate and a corresponding cold plate assembly and liquid cooling system that are resistive to the fouling from direct exposure to facility water and thus enables the data center cooling solution to be provided with a single cooling loop utilizing the facility water supply.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements can be provided with similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized. As a specific example, reference is made herein to the term facility liquid, facility water, facility cooling liquid, facility-grade cooling liquid, and cooling liquid. It is appreciated that the terms facility liquid or facility cooling liquid are utilized to provide a specific example of a cooling liquid supplied by/at a datacenter facility in which the heat generating electronic components are operating and being cooled in a single liquid cooling loop that includes facility liquid, which is typically unpurified water. Facility-grade cooling liquid is a more general term that can apply to both cooling liquid that is being provided at a datacenter facility or any other cooling liquid that can contain contaminants and particulates, similar to the normal facility liquid found in datacenters. Thus, facility-grade cooling liquid can apply to any type of liquid, regardless of the source of the liquid, and can also apply to liquid cooling that is not provided at a "facility" or datacenter. The descriptions herein are meant to apply to any type of facility-grade cooling liquid. Additionally, it is appreciated that the cooling liquid utilized within the cooling loop that includes the described cold plate assembly can also be a higher-grade cooling liquid than facility-grade cooling liquid, without limitation.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the figures presented herein.

FIG. 1 presents a three-dimensional disassembled view of cold plate assembly 100 having distributed impingement and recovery module (DIRM) 101 that liquid cools heat generating electronic component 102 on substrate 104. In an example, heat generating electronic component 102 includes central processing unit (CPU) integrated heat spreader 106 that is oriented toward cold plate assembly 100. In one or more embodiments, cold plate assembly 100 includes the following stacked components, referenced from closest to farthest away from heating generating electronic component 102: (i) two-dimensional (2D) vapor chamber 108; (ii) cold plate 110; (iii) optional restrictor plate 112; (iv) nozzle plate 114; (v) return port plate 116; and (vi) encapsulating lid 118. DIRM 101, which may include at least nozzle plate 114, return port plate 116, and internal portions of encapsulating lid 118, provides localized liquid cooling to cold plate 110.

Cold plate assembly 100 is held together by threaded fasteners 120 that pass through peripheral through holes 122 of encapsulating lid 118 to be received in threaded holes 124 on second surface 126 of cold plate 110. Encapsulating lid 118 is attachable to second surface 126 to form liquid cooling cavity 130. Encapsulating lid 118 includes intake port 132 and exhaust port 134. In one or more embodiments, encapsulating lid 118 has intake manifold 136 separated from return manifold 138 by return port plate 116. When cold plate assembly 100 is assembled, intake manifold 136 is in fluid communication with supply flow paths 142 of return port plate 116 and with intake port 132. Also, return manifold 138 is in fluid communication with return flow paths 144 of return port plate 116 and with exhaust port 134.

First surface (see 1301, FIG. 13) of cold plate 110 is oriented toward heat generating electronic component 102. Cold plate assembly 100 and optional 2D vapor chamber 108 are attached to heat generating electronic component 102 by cold plate retention plate 143 being engaged to locking pins 145 extending from substrate 104.

Encapsulating lid 118 has outer shell 146 that defines liquid cooling cavity 130. DIRM 101 includes optional restrictor plate 112, nozzle plate 114, return port plate 116 and components of encapsulating lid 118 internal to outer shell 146 (i.e., intake manifold 136 and return manifold 138). Components of cold plate assembly 100 are depicted in greater detail in FIGS. 2-14. Cold plate assembly 100 provides a multi-layer manifold solution of localized and distributed supply and return jet impingement pairs across the entire surface of cold plate 110 (see FIGS. 2-14) that disrupt a thermal boundary layer at a surface of cold plate 110. In one or more embodiments, each localized area of second surface 126 of cold plate 110 is impacted by a substantially perpendicular impingement of the portion of the cooling liquid. Supply cooling liquid at intake port 132 that has not been impinged cold plate 110 is kept separate from exhaust cooling liquid that has impinged cold plate 110 first by intake manifold 136 of encapsulating lid 118 (see FIGS. 8-14) and then by supply flow paths 142 of return port plate 116 to be provided to portions of nozzle plate 114 (see FIGS. 3, 6 and 7). Restrictor plate 112 (see FIGS. 5, 6 and 7), if present, reduces portions of nozzle plate 114 used for impinging supply cooling liquid on cold plate 110 for enhancing liquid cooling of portions of cold plate 110 that have higher levels of thermal energy to transfer (see FIGS. 10-14). Similarly, after passing through portions of nozzle plate 114, exhaust cooling liquid that has impinged cold plate 110 is kept separate from supply cooling liquid that has not impinged cold plate 110 first by return flow paths 144 of return port plate 116 and then by return manifold 138 of encapsulating lid 118, which channels the exhaust cooling liquid to exhaust port 134. For clarity, a simplified presentation of DIRM 101*a* provides a multi-layer manifold solution of the separating layers (i.e., return port plate 116 and encapsulating lid 118) that is presentable in a two-dimensional diagram is provided in FIG. 14 and described in greater detail below. Another example DIRM 101*b* provides serial liquid cooling with repeated impingements on cold plate 110 in FIGS. 1-25 and is described in greater detail below.

Figure 2:
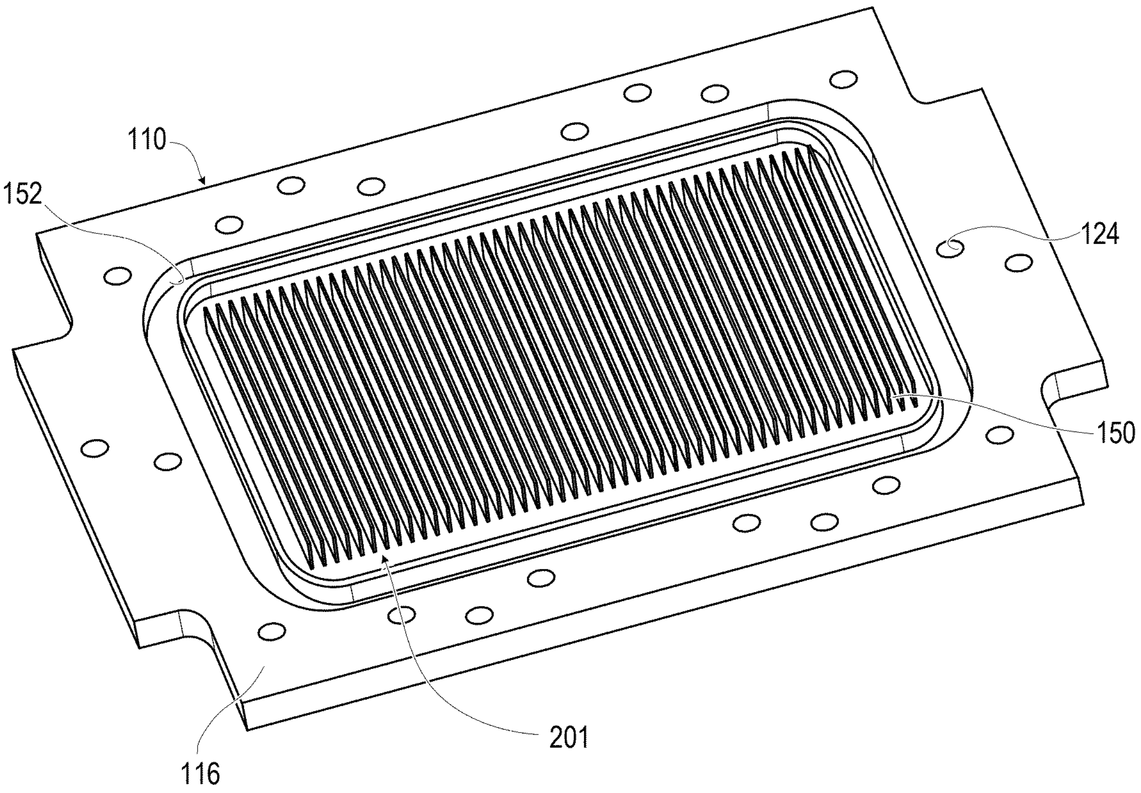
FIG. 2 is a three-dimensional view of the top surface of a cold plate of the cold plate assembly of FIG. 1, with an array of extended fins, according to one or more embodiments.

FIG. 2 presents a top (second surface) view of cold plate 110 of cold plate assembly 100 (FIG. 1). Lateral dimensions of cold plate 110 may accommodate one or more than one heat generating electronic component 102 (FIG. 1). With reference to FIGS. 1-2, cold plate 110 may be made of thermally conductive material such as copper facilitating heat transfer from attached heat generating electronic component 102 via a cooling liquid flow. Materials, including any treatments or coatings, of cold plate 110 are selected for compatibility and reliable use with the cooling liquid. In an example, the cooling liquid is water. Second surface 126 of cold plate 110 is configured with an array of extended fins 150. In one or more embodiments, interior perimeter 152 of cold plate 110 is recessed into second surface 126 around the array of extended fins 150 to facilitate sealing attachment of encapsulating lid 118 (FIG. 1) to cold plate 110. Sealably attaching encapsulating lid 118 (FIG. 1) to cold plate 110 may include use of one or more of a press-fit interference attachment, an adhesive layer, soldering, brazing, welding, and a fastener attachment. The holes 124 shown in the exterior perimeter area of second surface 126 can facilitate attaching cold plate 110 to the heat generating electronic component 102 and/or to the encapsulating lid 118.

Figure 3:
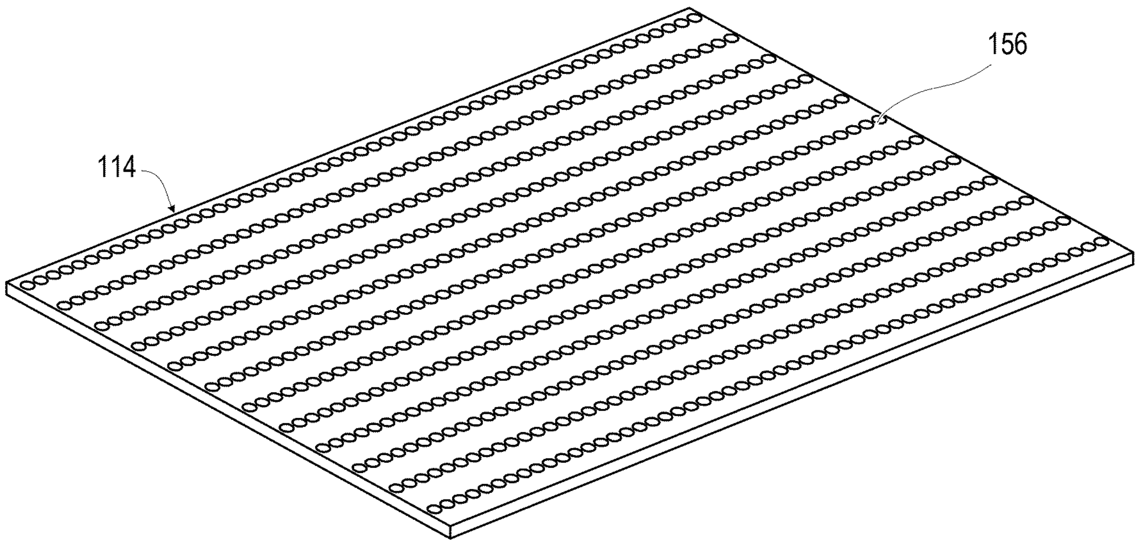
FIG. 3 is a three-dimensional view of a nozzle plate of the cold plate assembly of FIG. 1, according to one or more embodiments.
Figure 4:
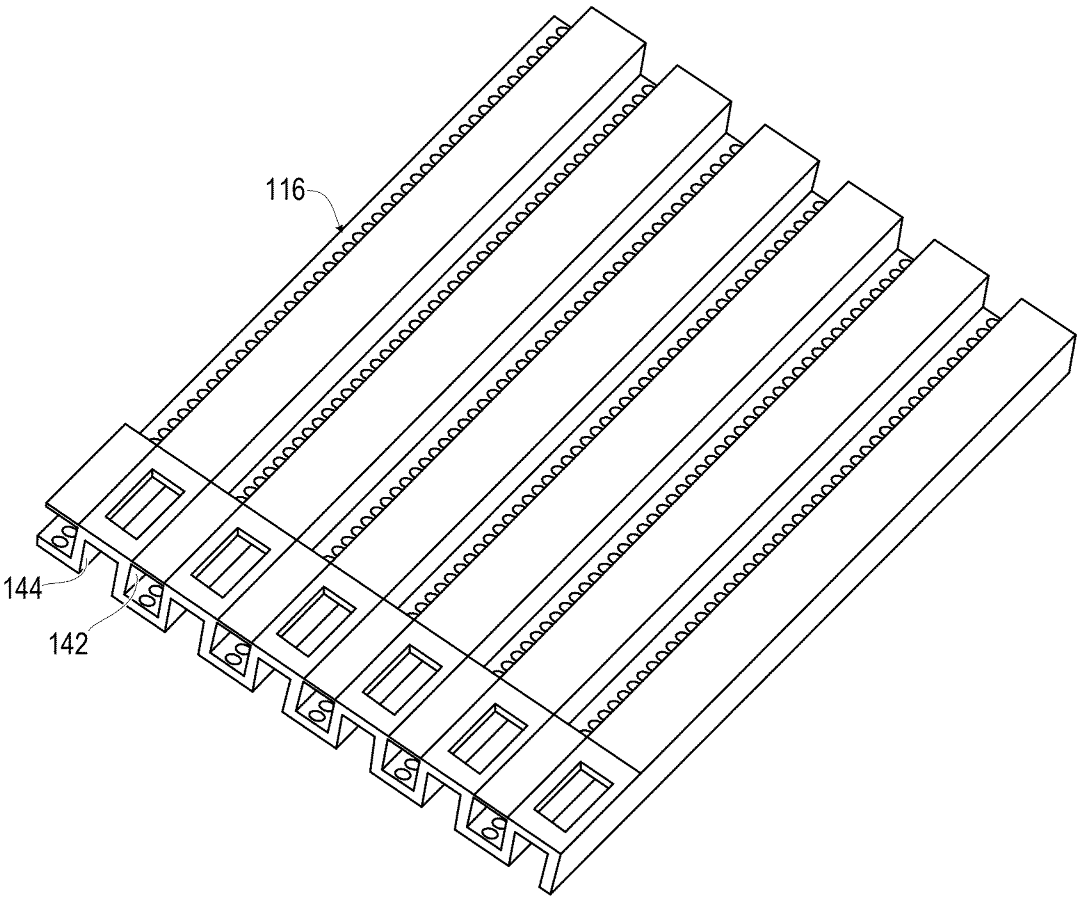
FIG. 4 is a three-dimensional view of a return port plate of the cold plate assembly of FIG. 1, according to one or more embodiments.

FIG. 3 presents nozzle plate 114 of cold plate assembly 100 (FIG. 1). With reference to FIGS. 1-3, nozzle plate 114 has a plurality of parallel rows of through holes 156 configured to create respective jets of cooling liquid that impinge second surface 126 of cold plate 110 (FIG. 1) and to return exhaust cooling liquid from the second surface 126 of cold plate 110. In other embodiments, the array of through holes may be irregularly spaced, including not being in identical rows. FIG. 4 presents return port plate 116 of cold plate assembly 100 (FIG. 1). In one or more embodiments, return port plate 116 is a baffle of alternating supply and return flow paths 142-144 configured to aligned with respective rows of nozzle through holes 156 (FIG. 3). For clarity, dimensions of the baffle are identical for each supply and return flow paths 142-144. In other embodiments, configuration of a baffle structure of return port plate 116 may include non-parallel channels that are not necessarily of the same dimensions to customize rate and volume of cooling liquid flow to areas on nozzle plate 114 (FIG. 1).

Figure 5:
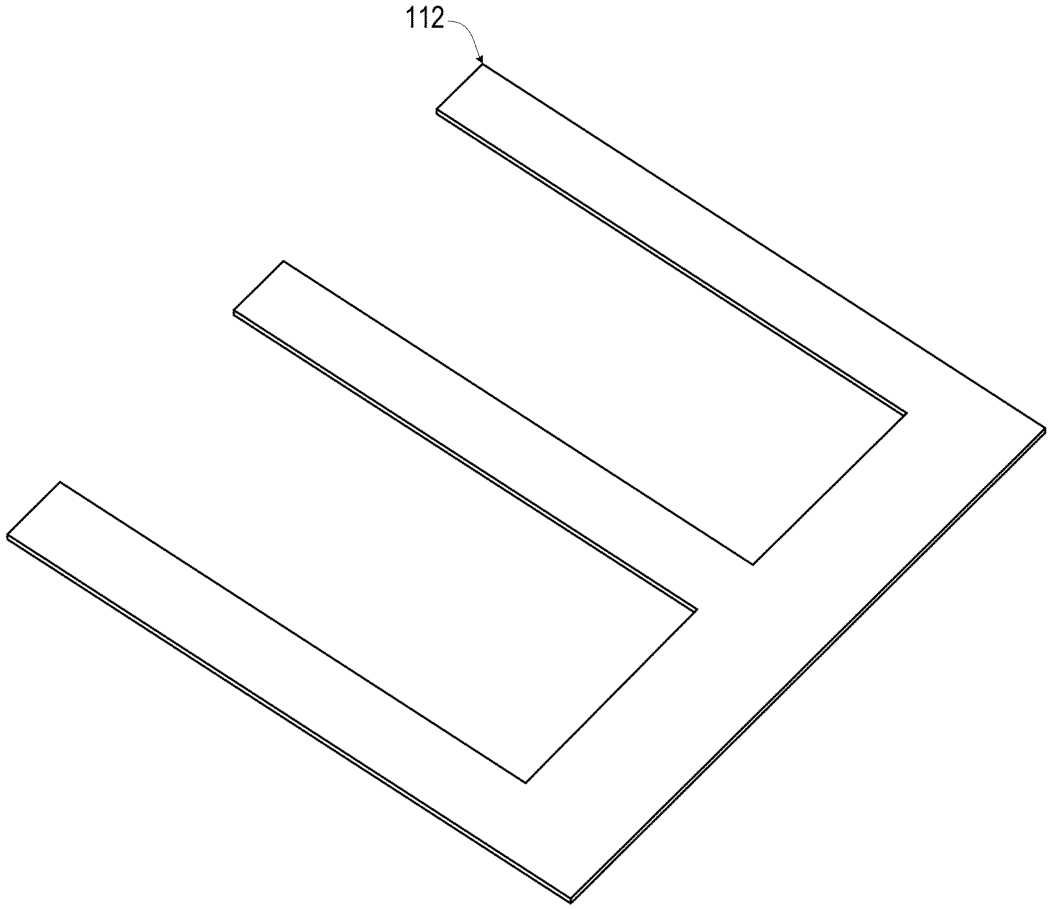
FIG. 5 is a three-dimensional view of a restrictor plate of the cold plate assembly of FIG. 1, according to one or more embodiments.
Figure 6:
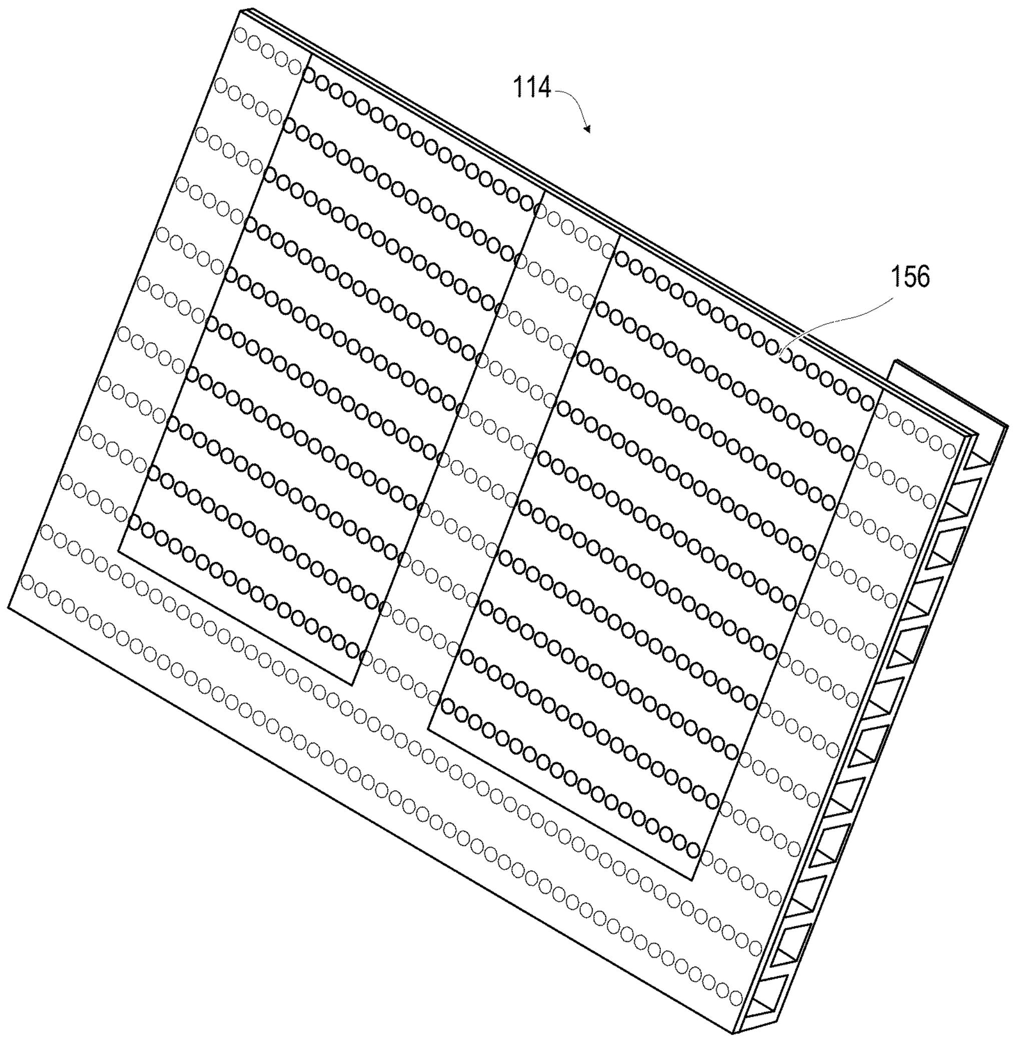
FIG. 6 is a three-dimensional view of the restrictor plate and return port plate positioned on the nozzle plate of the cold plate assembly of FIG. 1, according to one or more embodiments.
Figure 7:
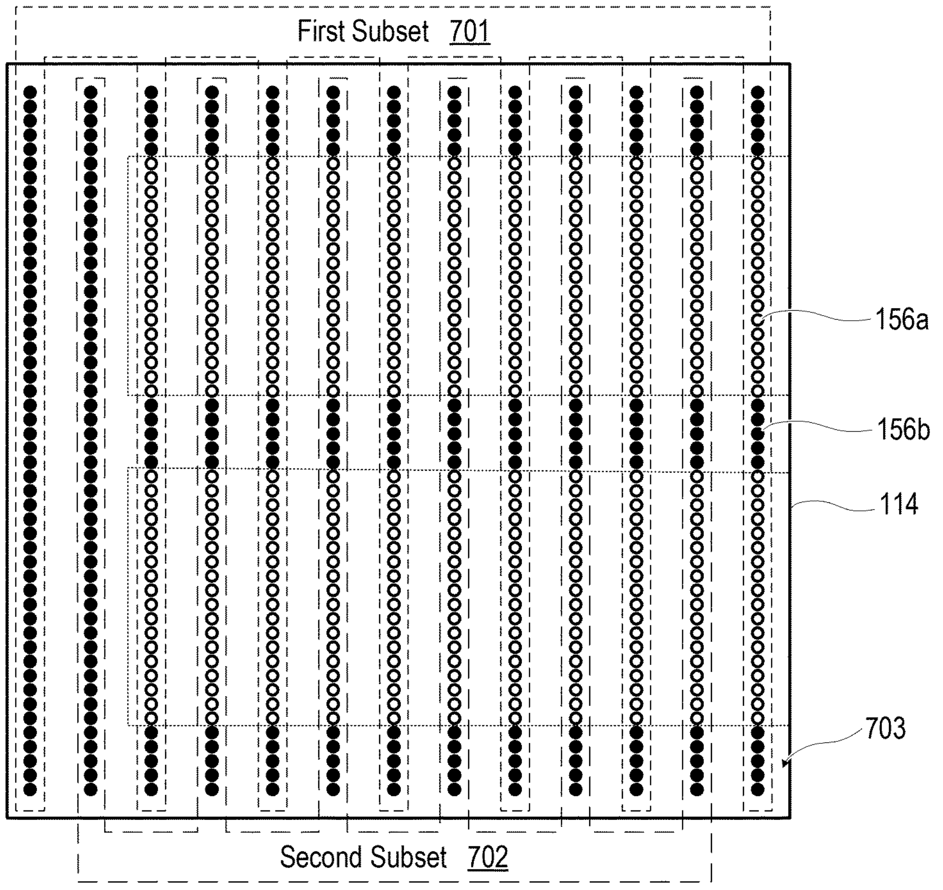
FIG. 7 is a top view of a nozzle plate of FIG. 6 with through holes including a first subset of nozzle orifices and a second subset of return orifices that are respectively either blocked (blackened) or not blocked (not blackened) by the restrictor plate of FIG. 5, according to one or more embodiments.

FIG. 5 presents restrictor plate 112 of cold plate assembly 100 of FIG. 1. FIG. 6 illustrates return port plate 116 positioned on nozzle plate 114 that is on restrictor plate 112. FIG. 7 is a top view of nozzle plate 114 of FIG. 6 having first and second subsets 701, 702 of nozzle and return through holes 156*a* respectively that are not blocked (not blackened) and nozzle and return through holes 156*b* that are blocked (blackened) by restrictor plate 112 (FIG. 5). Third subset 703 of through holes 156 (FIG. 1) corresponds to a portion of through holes 156*a*-156*b* blocked by restrictor plate 112 (FIG. 5). Second subset 702 (FIG. 7) is exclusive of first subset 701 (FIG. 7). Restrictor plate 112 is positionable between second surface 126 of cold plate 110 and nozzle plate 114 to block third subset 703 (FIG. 7) of nozzle and return through holes 156*b*. The shape of restrictor plate 112 is configured to correspond to nozzle through holes 156*a* and return through holes 156*b* that are not required to liquid cool heat generating electronic component 102. Respective portions of first subset and second subset 701-702 of the plurality of nozzle through holes 156 (FIG. 1) are left as unblocked nozzle and return through holes 156*a* for selective impingement of the cooling liquid on higher heat emitting surface areas of heat generating electronic component 102 (FIG. 1) and localized return of heated exhaust cooling liquid from the cold plate 110.

Figure 8:
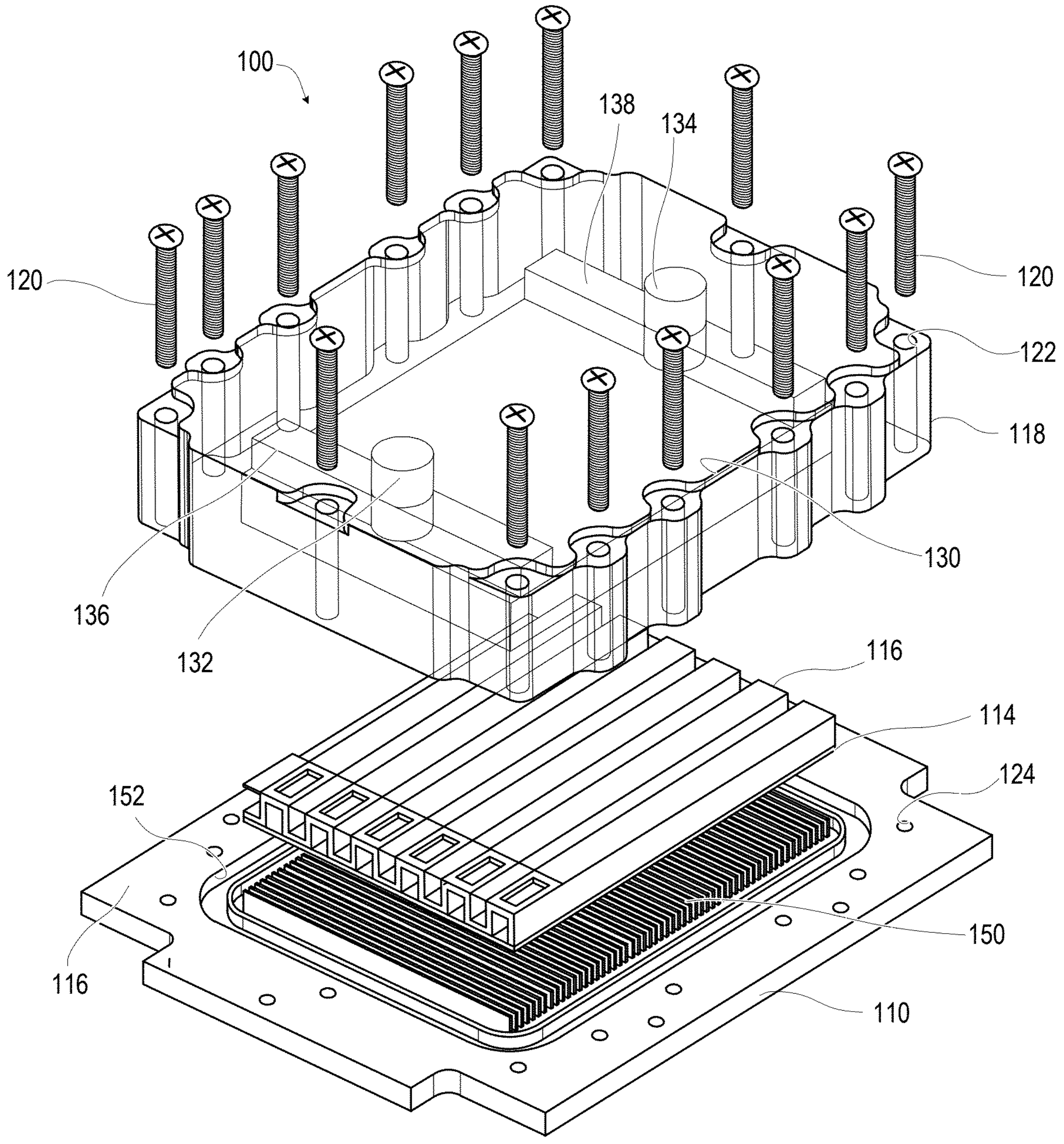
FIG. 8 is a three-dimensional view of the combination of the return port plate positioned on the nozzle plate situated between the encapsulating lid and cold plate of the cold plate assembly of FIG. 1, according to one or more embodiments.
Figure 9:
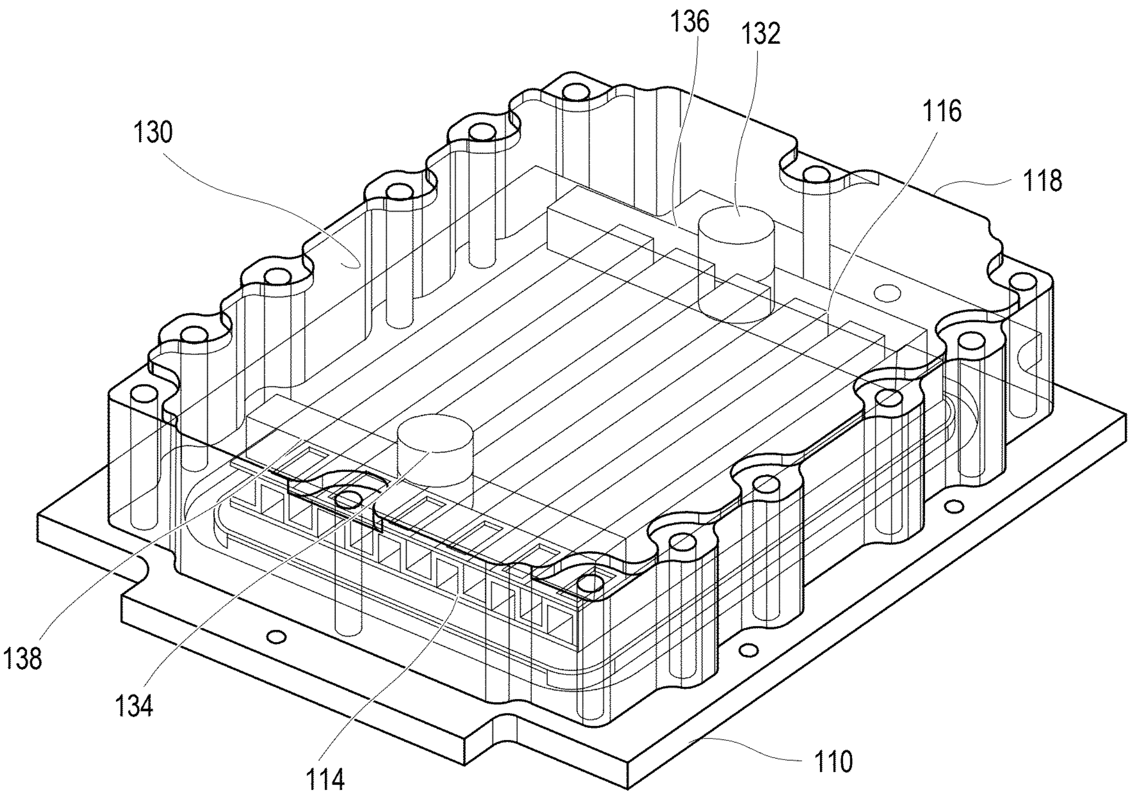
FIG. 9 is a three-dimensional assembled view of the encapsulating lid, return port plate, nozzle plate and cold plate providing an example cold plate assembly, according to one or more embodiments.
Figure 10:
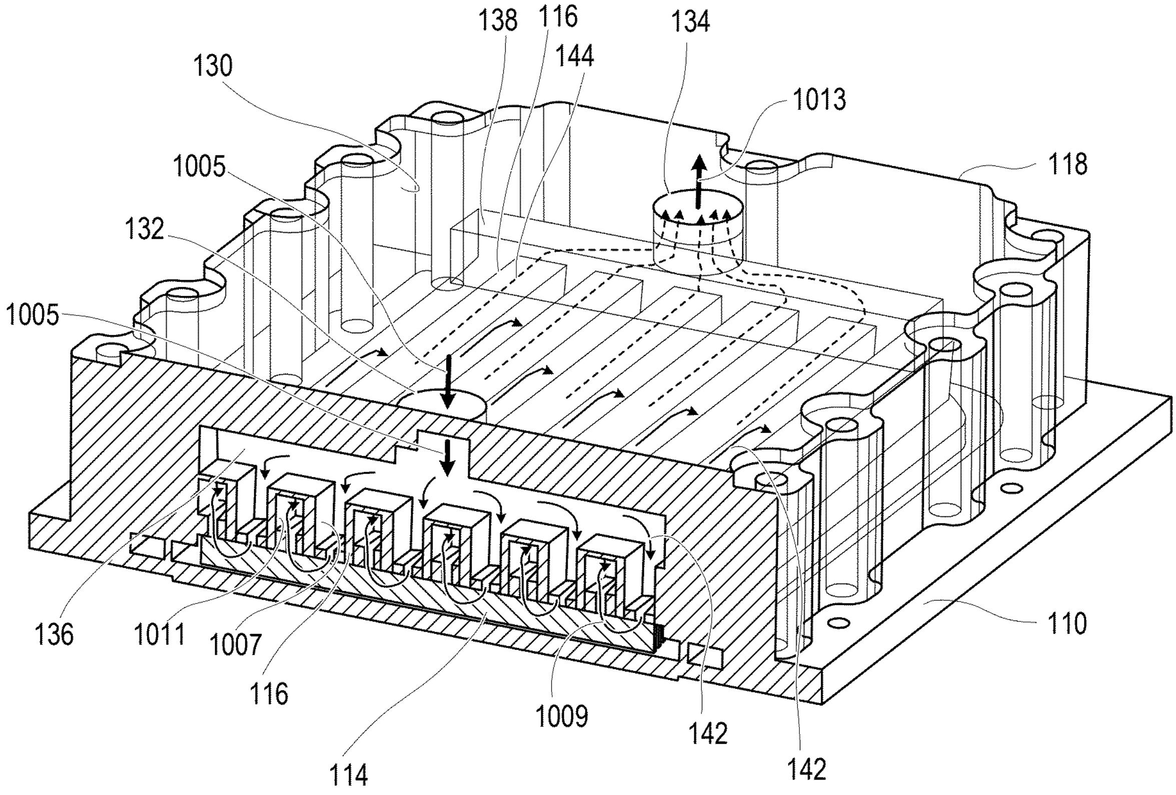
FIG. 10 is a cutaway three-dimensional view of the example cold plate assembly having the encapsulating lid, return port plate, nozzle plate, and cold plate and showing liquid flow direction via the intake channels and the return channels of the return port plate, according to one or more embodiments.
Figure 11:
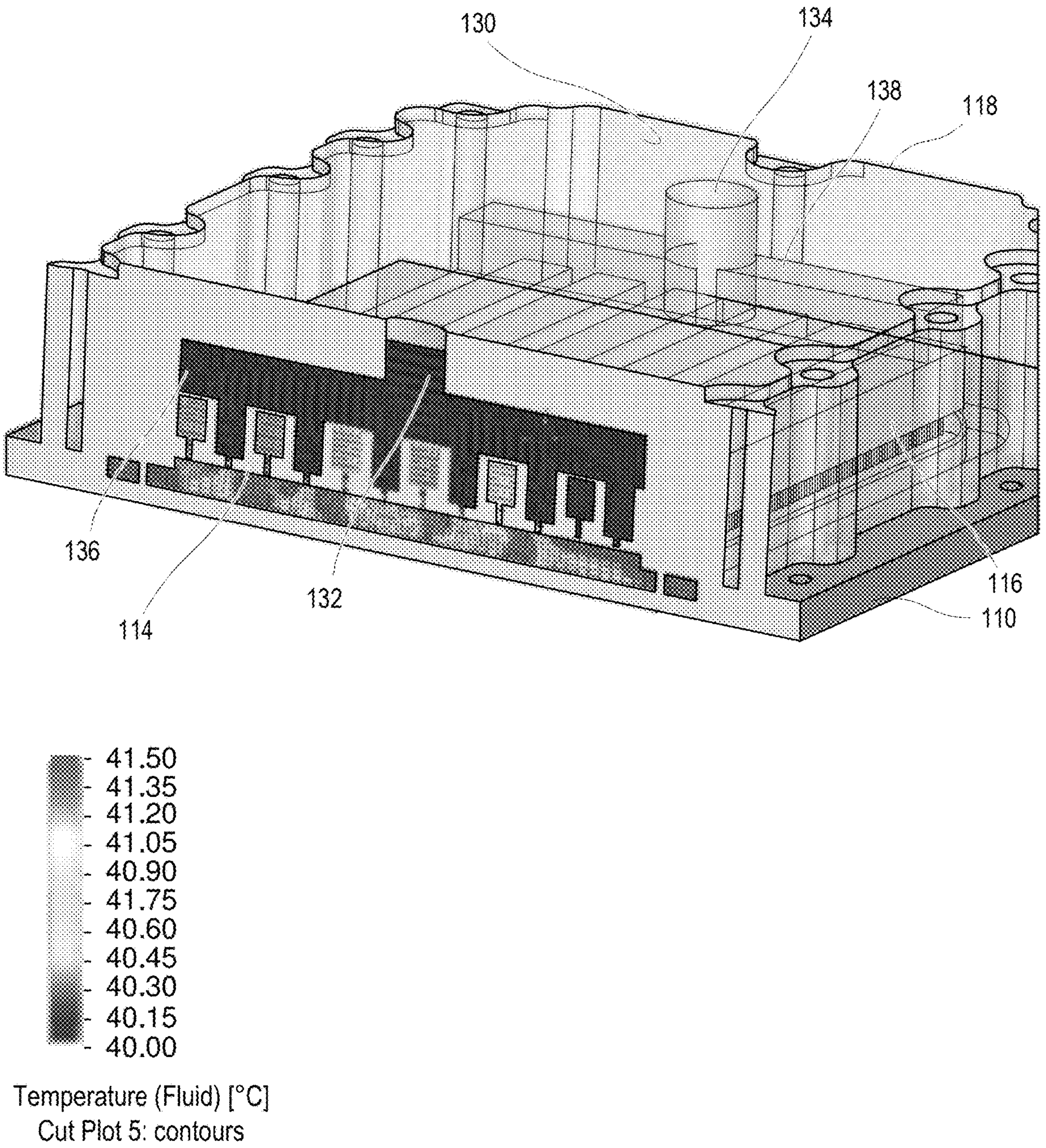
FIG. 11 is a cutaway three-dimensional view of the example cold plate assembly presenting simulated thermal imagery of the cooling liquid impinging on the surface of the cold plate through the nozzle ports and returning to the exhaust port via the adjacent return channels of the return port plate, according to one or more embodiments.
Figure 12:
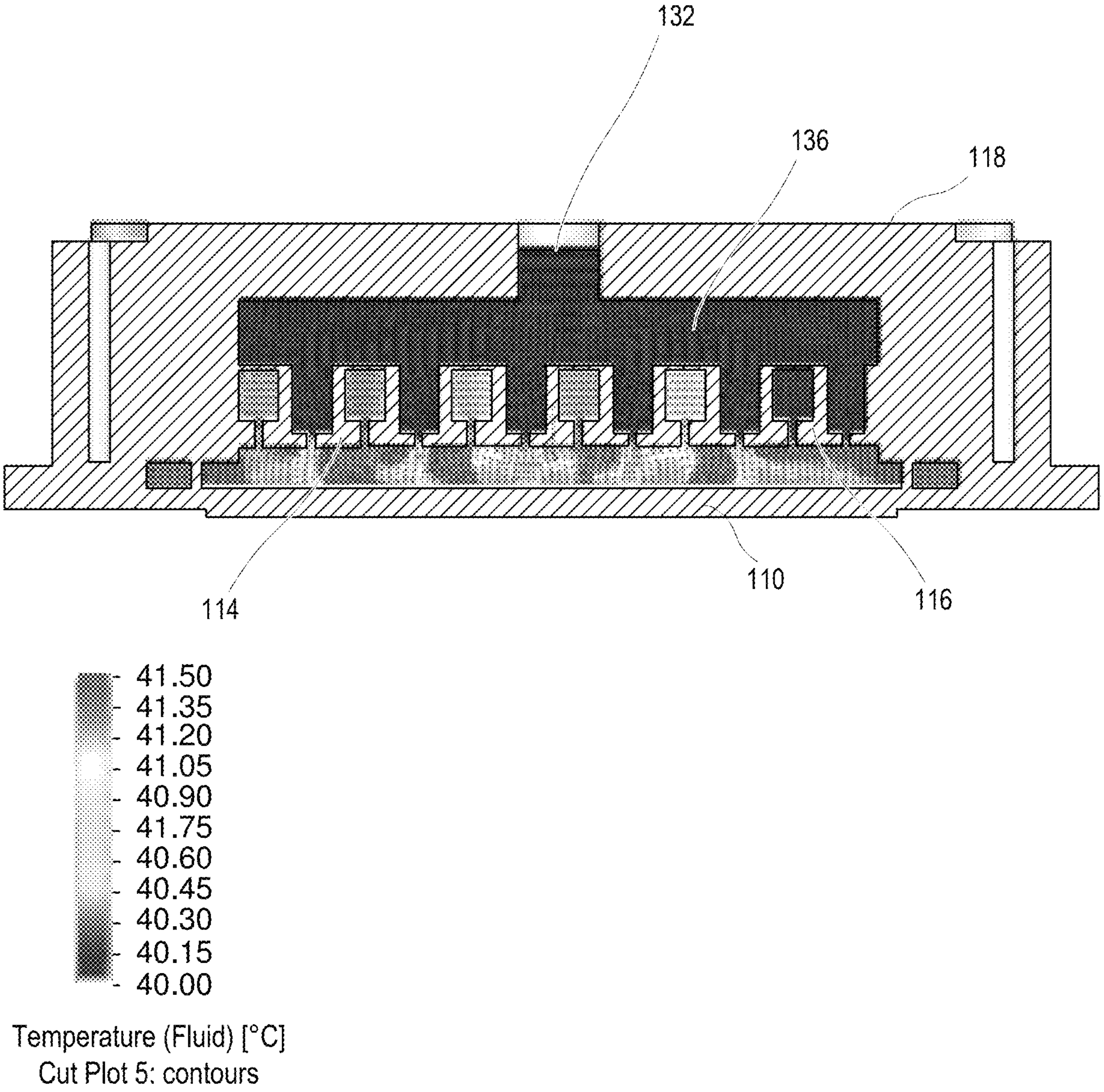
FIG. 12 is a cutaway two-dimensional side view of the example cold plate assembly of FIG. 10 with simulated thermal imagery of localized cooling (surface heat absorption) via return flow of the impinging cooling liquid through an adjacent nozzle port and return channel, according to one or more embodiments.
Figure 13:
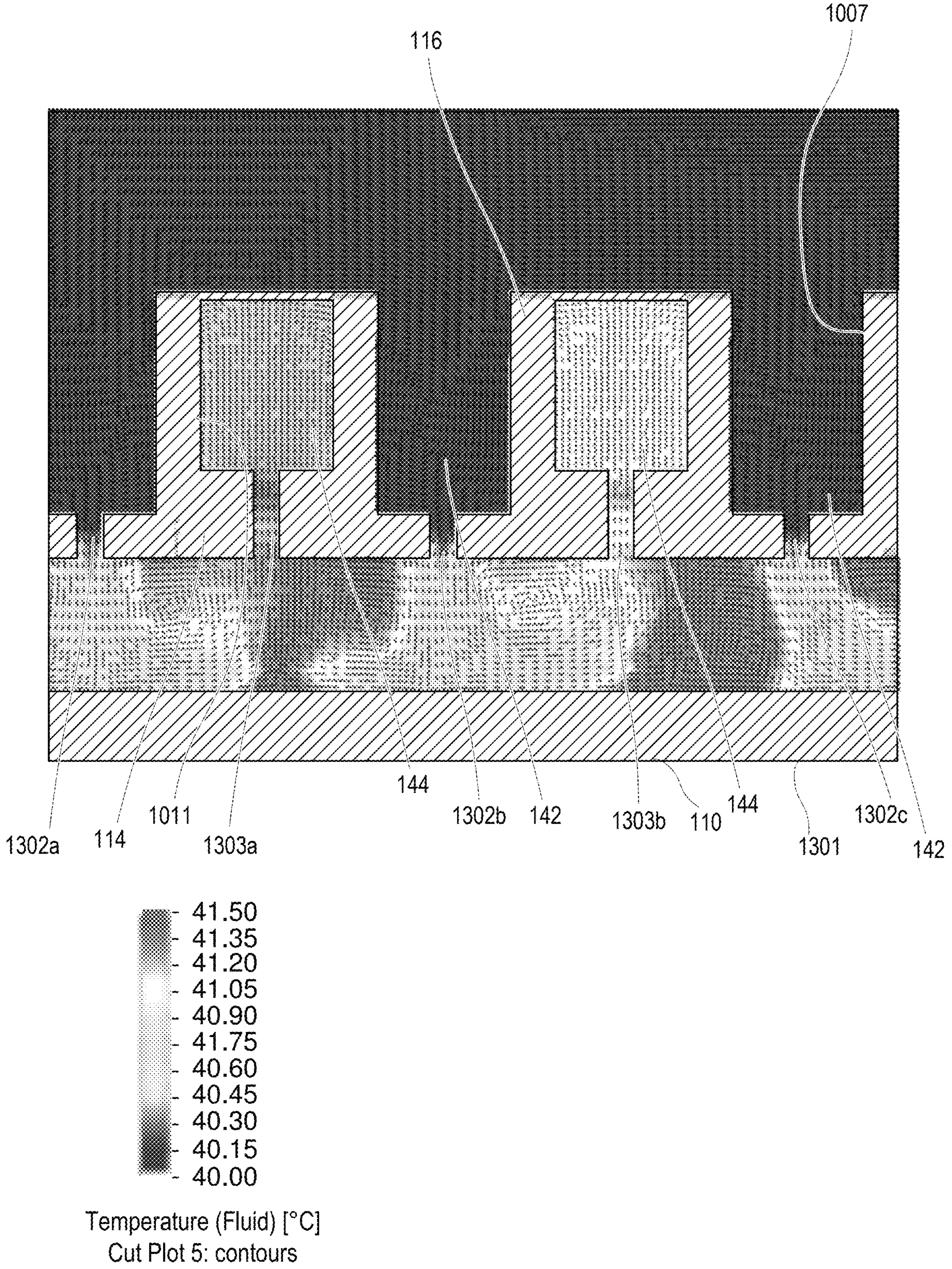
FIG. 13 is a close-up cutaway side view illustrating the cooling liquid flow via three nozzle orifices and two return ports of the cold plate assembly of FIG. 12, providing simulated thermal imagery, according to one or more embodiments.

FIG. 8 illustrates a combination of return port plate 116 situated on nozzle plate 114 between encapsulating lid 118 and cold plate 110 of cold plate assembly 100 of FIG. 1. Threaded fasteners 120 are shown prior to insertion through encapsulating lid 118. FIG. 9 illustrates assembled cold plate 110, nozzle plate 114, return port plate 116, and encapsulating lid 118 of cold plate assembly 100 of FIG. 1. Threaded fasteners 120 (FIG. 8) are omitted as being not yet installed. FIG. 10 is a cutaway three-dimensional view of cold plate assembly 100 having cold plate 110, nozzle plate 114, return port plate 116, and encapsulating lid 118 and showing liquid flow direction via intake channels and the return channels of the return port plate. Threaded fasteners 120 (FIG. 8) are omitted but would be installed prior to supplying cooling liquid to cold plate assembly 100. FIG. 11 is a cutaway three-dimensional view of cold plate assembly 100 presenting simulated thermal imagery of the cooling liquid impinging on second surface 126 of cold plate 110 through nozzle orifices and returning to the exhaust port via the adjacent return channels of the return port plate 116. FIG. 12 is a two-dimensional cutaway side view of cold plate assembly 100 of FIG. 11 with simulated thermal imagery of localized cooling (surface heat absorption) via return flow of the impinging cooling liquid through an adjacent nozzle orifice and return channel. FIG. 13 is a close-up cutaway side view cold plate assembly of FIG. 12 illustrating the cooling liquid flow via three (3) nozzle orifices 1302*a*, 1302*b*, and 1302*c* and two (2) return orifices 1303*a* and 1303*b* providing simulated thermal imagery.

With ongoing reference to FIG. 1 and the other preceding figures, nozzle plate 114 is positioned as a first layer proximate and parallel to second surface 126 of cold plate 110. Return port plate 116 is positioned as a second layer stacked on nozzle plate 114. Return port plate 116 has more than one supply flow paths that channel cooling liquid from intake port 132 of encapsulating lid 118 to first subset 701 (FIG. 7) of the plurality of through holes 156 in nozzle plate 114 that function as nozzle orifices 1302*a*-1302*c* (FIG. 13) to create nozzle jets of cooling liquid. Return port plate 116 has one or more return flow paths adjacent to supply flow path(s). Return flow paths 144 channel exhaust liquid from second subset 702 (FIG. 7) of the plurality of through holes 156 that function as return orifices 1303*a*-1303*b* (FIG. 13) to exhaust port 134 of encapsulating lid 118.

With particular reference to FIG. 10, supply cooling liquid 1005 enters intake port 132 of encapsulating lid 118 and is distributed as by intake manifold 136 as supply flow path 142 into each upwardly open channel 1007 of return port plate 116 to pass through nozzle plate as nozzle jets 1009 impinging cold plate 110. Nozzle jets 1009 disrupt a thermal boundary layer and the incoming cooling liquid becomes exhaust cooling liquid that passes back through nozzle plate 114 to enter adjacent downwardly open channel 1011 of return port plate 116. The exhaust cooling liquid is channeled by return flow paths 144 that move laterally into return manifold 138 of encapsulating lid 118. Return flow paths 144 combine at return manifold 138 into return (exhaust) cooling liquid 1013 that is channeled by exhaust port 134 out of cold plate assembly 100.

With particular reference to FIG. 13, return flow paths 144 of the return port plate are downwardly open channels 1011 that sealably contact nozzle plate 114 on each side of a corresponding at least one first row of the nozzle through holes 156 of nozzle plate 114. Downwardly open channels 1011 are separated by upwardly open channels 1007. Contact portions of return port plate 116 are adjacent to downwardly open channel 1011 configured to sealably contact around a corresponding at least one second row of the nozzle through holes of the nozzle plate, the contact portions having one or more openings aligned with the second row of the nozzle through holes to fluidly communicate with the liquid cooling cavity under the encapsulating lid. One or more nozzle orifices 1302*a*-1302*c* (FIG. 13) are located proximate to one or more return orifices 1303*a*-1303*b* (FIG. 13), creating localized cooling flow paths and recovery of the cooling liquid that disrupt a thermal boundary layer at second surface 126 of cold plate 110.

Figure 14:
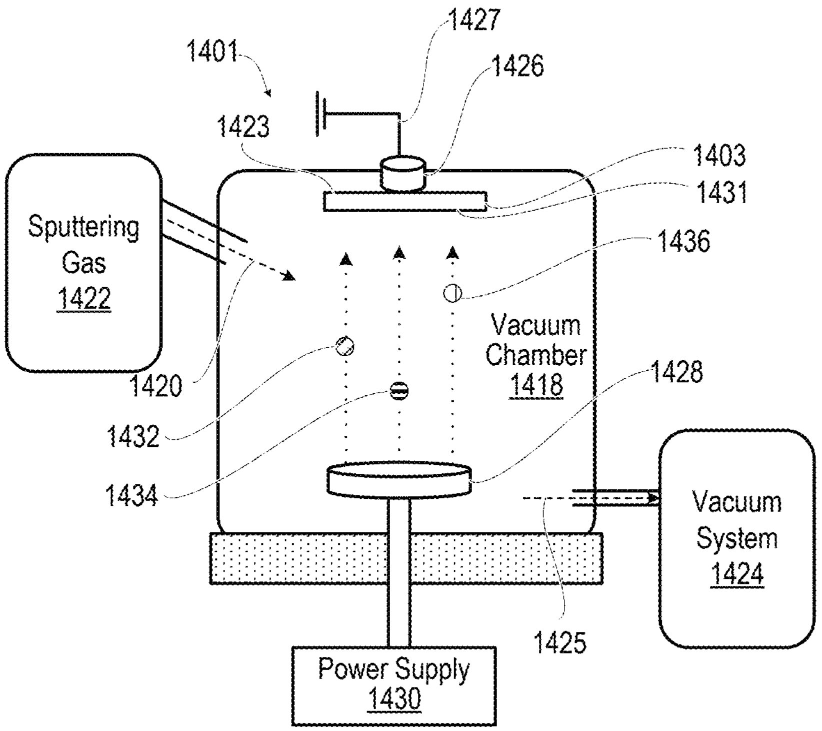
FIG. 14 illustrates a physical vapor deposition (PVD) process for coating wetted surfaces of the example cold plate assembly of FIG. 1 with a protective coating, which protects the wetted surfaces from damage, deterioration, and/or clogging due to exposure to facility-grade cooling liquids, according to one or more embodiments.

FIG. 14 illustrates a physical vapor deposition (PVD) apparatus 1401 that performs a process for coating wetted surfaces of liquid cooling components 1403 of cold plate assembly 100 (FIG. 1) with a protective coating, which protects the wetted surfaces from damage, deterioration, and/or clogging due to exposure to facility-grade cooling liquids. Unlike conventional devices, environmentally hardened liquid cooling components 1403 of cold plate assembly 100, with a protective surface coating, are tolerant of poorly controlled water quality (including from both chemical contaminants and particulates). Examples of liquid cooling component 1403 include cold plate 110, restrictor plate 112, nozzle plate 114, return port plate 116, and liquid cooling cavity 130 of encapsulating lid 118 (FIG. 1).

To facilitate use of a facility cooling liquid, such as unpurified water, liquid cooling component 1403 is environmentally hardened, such as by applying a coating in physical vapor deposition (PVD) apparatus 1401. PVD apparatus 1401 includes three-dimensional (3D) vapor chamber 1418 that is filled with sputtering gas 1420 received from sputtering gas supply 1422 and that is maintained at an appropriate pressure by vacuum system 1424 that removes excess gas 1425. Upward oriented surface 1423 of liquid cooling component 1403 is engaged to substrate holder 1426, which is connected to electrical ground 1427. Downward oriented surface 1431 of liquid cooling component 1403 is oriented toward target 1428, which includes one or more coating materials to be deposited onto downward oriented surface 1431 of liquid cooling component 1403 by PVD. Target 1428 is connected to power supply 1430 to cause ionization of sputtered atoms 1432, 1434, and 1436, which are attracted by the voltage difference between target 1428 and liquid cooling component 1403 to that transit across vacuum chamber 1418 and be deposited onto downward oriented surface 1431 of liquid cooling component 1403 to form a protective coating. In an example, first atom 1432 represents a hydrophobic material, second atom 1434 represents a non-conductive material, and third atom 1436 represents an anti-corrosive material. Wetted surfaces cold plate 110 are coated with non-conductive, anti-corrosion surface enhancements such as Zirconium Nitride, Titanium Nitride, and other ceramics applied by PVD. In one or more embodiments, the surface may also be coated with a hydrophobic surface treatment to mitigate scale and sedimentation. The specific description of PVD as the process is thus not intended to be limiting on the scope of the disclosure. To coat all wetted surface of liquid cooling component 1403, liquid cooling component 1403 may be processed by PVD while in more than one orientation so that each wetted surface is coated.

It is appreciated that while the coating process is shown to be completed by PVD, other similar techniques can be utilized to provide the coating layer(s) on first surface 1301 of cold plate 110 (FIG. 13) to yield the various physical and chemical enhancements that are described herein. In an example, liquid cooling component 1403 or an assembly of liquid cooling components 1403 may be dipped or immersed into liquid that provides the surface treatment.

Facility water, which may contain corrosive chemical and particulate contaminants would be suboptimal for liquid cooling using conventional cold plates. In one or more embodiments, the protective coating applied to the cold plate by the above-described PVD process provides one or more protective characteristics, including: (i) a hydrophobic characteristic to mitigate scaling by calcium carbonate, (ii) an anti-corrosive characteristic to mitigate formation corrosion, and (iii) a non-conductive characteristic to mitigate rusting. Cold plate assembly 100 (FIG. 1) covered at least in part with the resulting coating is designed to resist heat transfer inhibiting failure modes common to liquid cooling with poorly regulated water quality, namely suspended solid particulates, biological growth potential, and harsh water chemistry conditions, including semi-corrosive mixtures.

Figure 15:
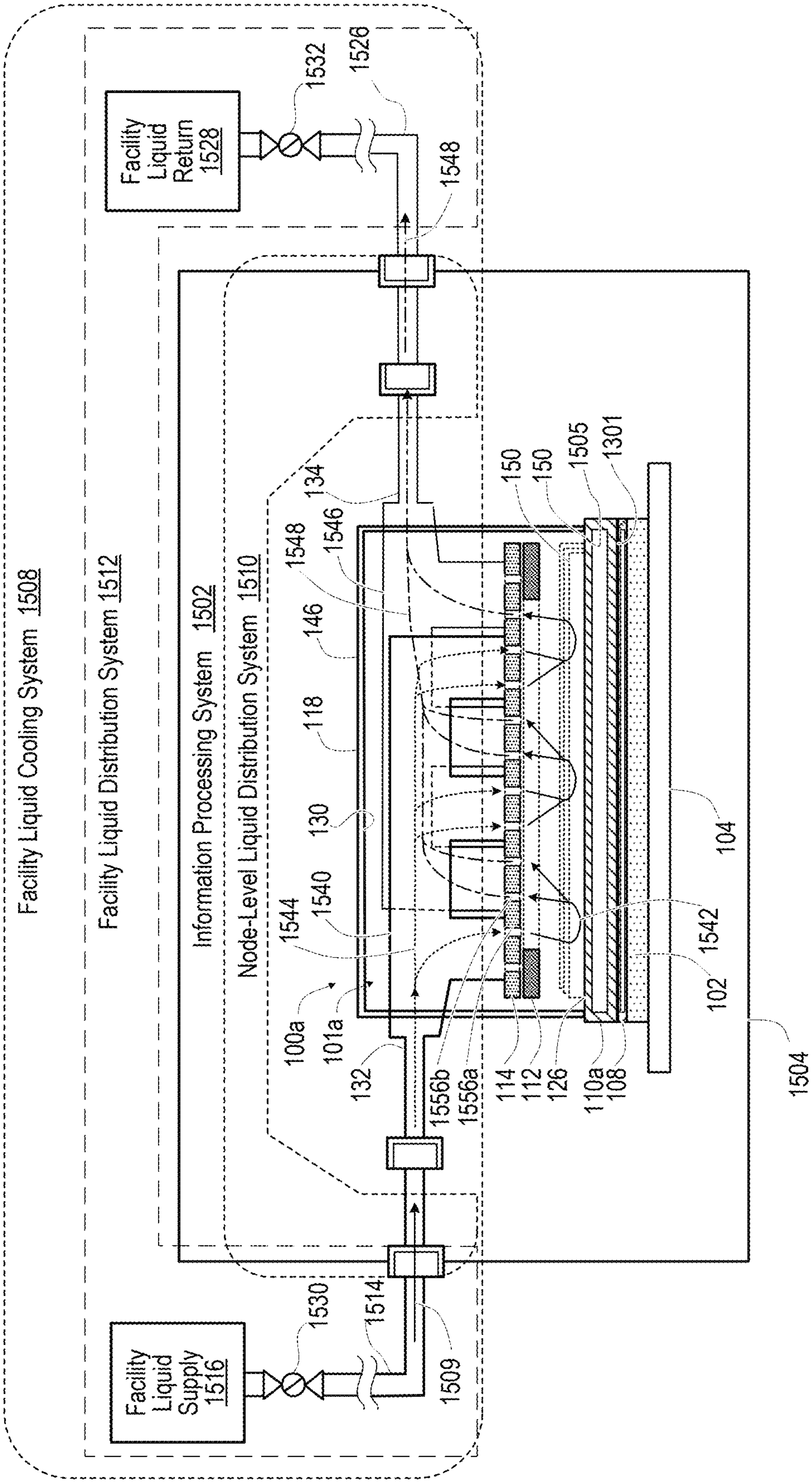
FIG. 15 presents a three-dimensional disassembled view of an example cold plate assembly, which has another example DIRM having localized liquid cooling of a heat generating electronic component, according to one or more embodiments.

FIG. 15 illustrates an example information processing system (IPS) 1502 including heat generating electronic component 102 with attached cold plate assembly 100*a* and connected to a facility liquid cooling system 1508 that provides liquid cooling supply 1509 to node enclosure 1504 within which the IPS 1502 is located. In the presented embodiment, cold plate 110*a* of cold plate assembly 100*a* includes integral vapor chamber 1505 extending from a base (first) surface of cold plate 110*a*, with the other, opposed surface of vapor chamber 1505 in thermal connection with heat spreader surface of the heat generating electronic component 102 of IPS 1502. In one or more embodiments, cold plate assembly 100*a* has a solid cold plate 110 without an integral vapor chamber and also does not include 2D vapor chamber 108. In one or more alternate embodiments, cold plate assembly 100*a* has a solid cold plate without an integral vapor chamber but does include 2D vapor chamber 108. In one or more additional embodiments, cold plate assembly 100*a* has cold plate 110 with integral vapor chamber 1505 and does not include 2D vapor chamber 108. In one or more embodiments, cold plate assembly 100*a* has a solid cold plate 110 without an integral vapor chamber but does include 2D vapor chamber 108.

In one or more embodiments, as shown by FIG. 15, intake port 132 and exhaust port 134 may be positioned on opposite lateral sides of cold plate assembly 100*a*. In one or more embodiments, intake port 132 and exhaust port 134 may be positioned on adjacent lateral sides. In one or more embodiments, intake port 132 and exhaust port 134 may be positioned on the same lateral side. In one or more embodiments, intake port 132 and exhaust port 134 may both be positioned on the top side. In one or more embodiments, intake port 132 and exhaust port 134 may be positioned respectively on the top side and one lateral side. In the illustrated embodiment, DIRM 101*a* of cold plate assembly 100*a* includes restrictor plate 112, nozzle plate 114 and components internal to outer shell 146 of encapsulating lid 118 of cold plate assembly 100. In one or more embodiments, encapsulating lid 118 includes supply manifold system 1540 sealably connected for liquid transfer from intake port 132 to first subset 701 (FIG. 7) of through holes 1556*a* ("nozzle holes") in nozzle plate 114, when not blocked by restrictor plate 112, configured to create a corresponding plurality of nozzle jets 1542 that impinges the array of extended fins 150. Supply manifold system 1540 channels distributed cooling liquid 1544. In addition, encapsulating lid 118 includes return manifold system 1546 sealably connected for liquid transfer of converging heated cooling liquid 1548 to exhaust port 134 from second subset 702 (FIG. 7) of the plurality of return orifices 1556*b*, when not blocked by restrictor plate 112, exclusive of and alternating with, first subset 701 (FIG. 7) of the plurality of through holes 1556*a*. The juxtaposition of nozzle jets 1542 impinging cooling liquid through first subset 701 (FIG. 7) of through holes 1556*a* that are alternating with/adjacent to corresponding second subset of return orifices 1556*b* and aligned with the array of extended fins 150 creates a plurality of localized cooling liquid flows between adjacent through holes 1556*a* ("nozzle holes") and return orifices 1556*b*. This configuration of localized cooling liquid flow paths disrupts a thermal boundary layer at second surface 126 of cold plate 110, resulting in more efficient and faster cooling of the associated heat generating electronic component 102.

IPS 1502 includes one or more heat generating electronic component(s), presented as example heat generating electronic component 102 (FIG. 1). Liquid cooling system 1508 provides cooling liquid supply 1509 to cold plate assembly 100*a* to cool one or more heat generating electronic component 102. Liquid cooling system 1508 includes node-level liquid distribution system 1510 within node enclosure 1504 and that is part of IPS 1502. Liquid cooling system 1508 includes rack level and/or data center level liquid distribution system, which are external to IPS 1502 and node enclosure 1504. For simplicity, rack level and/or data center level liquid distribution system will collectively be referred to as facility liquid distribution system 1512 to distinguish from the node-level liquid distribution system 1510. Facility liquid distribution system 1512 includes supply distribution conduit 1514 sealably coupled to facility liquid supply 1516 via intake port 132 for liquid transfer to provide unheated facility liquid, such as water, to intake port 132 of node-level liquid distribution system 1510. Exhaust port 134 of node-level liquid distribution system 1510 returns heated cooling liquid 1548 that has passed through cold plate assembly 100. Facility liquid distribution system 1512 includes return distribution conduit 1526 sealably coupled to exhaust port 134 for liquid transfer to facility liquid return 1528. Encapsulating lid 118 is configured to sealably couple for fluid flow via liquid conduits (i.e., node-level liquid distribution system 1510 and facility liquid distribution system 1512) from facility liquid supply 1516 and to facility liquid return 1528. Liquid flow through liquid cooling system 1508 may be controlled by a binary or proportional electrically actuated supply valve 1530 that is incorporated into supply distribution conduit 1514. Alternatively, or in addition, liquid flow through liquid cooling system 1508 may be controlled by a binary or proportional electrically actuated return valve 1532 that is incorporated into return distribution conduit 1526.

In one or more embodiments, cold plate assembly 100*a* includes DIRM 101*a* having supply manifold system 1540 sealably connected for liquid transfer from intake port 132 to a first subset 701 (FIG. 7) of through holes 156 in nozzle plate 114, when not blocked by restrictor plate 112, configured to create a corresponding plurality of nozzle jets 1542 that impinges the array of extended fins 150. DIRM 101*a* includes return manifold system 1546 sealably connected for liquid transfer of heated cooling liquid 1548 to exhaust port 134 from a second subset of the plurality of through holes 156, exclusive of and alternating with, the first subset of the plurality of through holes 156, when not blocked by restrictor plate 112. DIRM 101*a* creates a localized liquid flow aligned with the array of extended fins between adjacent through holes aligned with the array of extended fins that disrupt a thermal boundary layer at the second surface of the cold plate.

Figure 16:
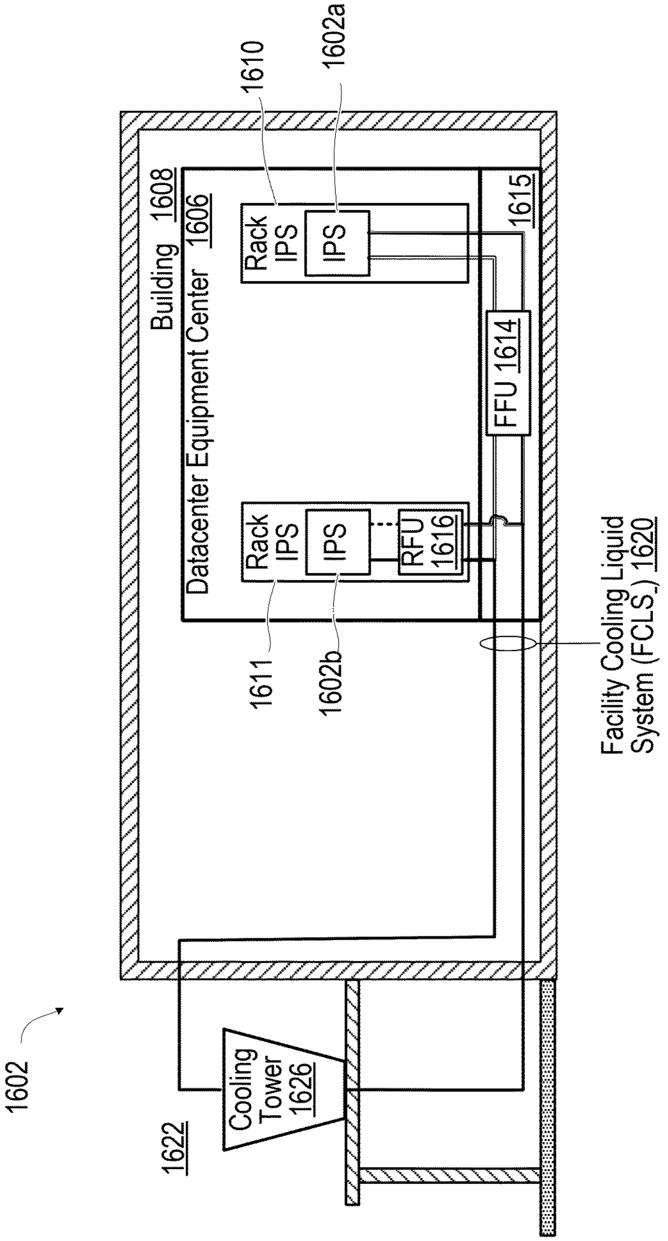
FIG. 16 is a diagram of a first example liquid cooling system that supports a datacenter equipment center with rack-level liquid cooling of heat generating electronic components, each utilizing an attached one of the cold plate assembly 100 of FIG. 1, and utilizing one liquid cooling loop for heat exchange, according to one or more embodiments.

IPS 1502 may be located in a node of an information processing system rack (see FIG. 16). FIG. 16 is a diagram of a first example liquid cooling system that supports a datacenter equipment center with rack-level liquid cooling of heat generating electronic components, each utilizing an attached one of the cold plate assembly 100 of FIG. 1, and utilizing one liquid cooling loop for heat exchange, according to one or more embodiments. In the provided example, datacenter equipment center 1606 within building 1608 includes two rack information processing systems (IPSes) 1610 and 1611 that have information processing systems (IPSes) 1602*a* and 1602*b* respectively, which receive liquid cooling by respective ones of cold plate assembly 100 (as presented in FIG. 1 or 15). In one or more embodiments, rack IPS 1610 is supported by floor filtration unit (FFU) 1614 in floor space 1615 of datacenter equipment center 1606. Rack IPS 1611 is supported by rack filtration unit (RFU) 1616. Liquid cooling system 1602 includes a single liquid cooling loop, facility cooling liquid system (FCLS) 1620. FCLS 1620 circulates facility liquid from cooling tower 1626 (or a facility supply) through conduits to the data center and IPSes in rack IPS 1610, 1611, and from each cold plate back to cooling tower 1626 (or facility return) to dissipate thermal energy to ambient air 1622. Utilization of cold plate assembly 100/100*b* to provide liquid cooling of heat generating components within the data center (e.g., as shown in FIG. 16) eliminates the need for use of purified liquid in a separated rack level technology cooling system and the multiple separated cooling loops to provide reliable operation of a liquid cooling system.

Aspects of the present disclosure may be applied to multiple cooling loop systems. In an example, a liquid cooling system may include four isolated liquid cooling loops in series, a technology cooling system (TCS), a facility cooling liquid system (FCLS), and a condenser liquid system that support rack IPSes. A chiller loop may be counted as an additional liquid cooling loop. TCS is supported by a cooling distribution unit (CDU) that circulates cooling liquid through an IPS via a closed loop. CDU transfers thermal energy from the TCSs to facility cooling liquid such as unpurified water provided by a facility cooling system (FCLS). In an example, FCLS may transfer exhaust thermal energy directly into ambient air via a cooling tower. The liquid cooling system may further include a condenser liquid system (CLS) that circulates cooling water through the cooling tower. The liquid cooling system may further include the chiller loop (or chiller) that stores a thermal buffering quantity of liquid such as water. The chiller circulates the water through a first liquid-to-liquid heat exchanger to receive thermal energy from FCLS. The chiller circulates the heated water through a second liquid-to-liquid heat exchanger to transfer thermal energy to the CLS. The chiller enables intermittent use of the cooling tower while maintaining water in the chiller within a temperature range suitable for both FCLS and CLS.

Utilization of a cold plate assembly to provide liquid cooling of heat generating components within the data center eliminates the need for use of purified liquid in a separated rack level technology cooling system and the multiple separated cooling loops to provide reliable operation of the liquid cooling system. An existing data center cooling system can be retrofitted with IPSes that are configured with a plurality of a cold plate assembly as the mechanism for cooling the heat generating components within the IPS racks and replace the more expensive purified cooling liquids within the technology cooling system loop, without having issues related to fouling of the cold plates with the switch to utilizing normal, facility rated liquid supply.

Aspects of the present disclosure may be applied to an edge mobile datacenter or facility with a single rack IPS. Additionally, aspects of the present disclosure may also be applied to an enterprise datacenter having multiple buildings and rooms with tens, hundreds, or thousands of rack IPSes. In one or more embodiments, a facility source of facility-grade cooling liquid may include a facility outlet port and a facility return port. A liquid distribution system may be sealably connected between the intake port of the cold plate assembly and an outlet port of the facility source to channel unheated facility water to the cold plate assembly and between the exhaust port of the cold plate assembly and the facility return port to channel heated exhaust water from the cold plate assembly to the facility return port.

In one or more embodiments, the liquid distribution system includes a rack liquid cooling manifold system with a supply manifold and a return manifold. The supply manifold includes a supply control valve and a manifold intake port available for sealably coupling to a facility water supply to receive a cooling liquid. The supply manifold includes more than one server supply ports. Each server supply port is available for sealably coupling, for liquid transfer of the cooling liquid, to a respective cooling liquid supply input of a corresponding information processing system node supported by a rack frame capable of supporting multiple information processing system nodes. Each information processing system node has one or more heat generating electronic components. The return manifold includes a facility water return port for sealably coupling to a facility return to exhaust the cooling liquid. The return manifold includes more than one server return ports. Each server return port is available for sealably coupling, for exhaust liquid transfer, to a respective cooling liquid exhaust output of the corresponding information processing system node. The respective cooling liquid exhaust output and a paired supply liquid cooling input directs cooling liquid flow through one or more cold plate assembly positioned within the corresponding information processing system node to thermally cool the one or more heat generating electronic components.

In one or more particular embodiments, the liquid distribution system further includes a plurality of conduits that sealably couple for liquid transfer: (i) the more than one server supply ports of the supply manifold to the corresponding server supply inputs of the more than one information processing system nodes; (ii) the corresponding server supply input to the one or more cold plate assemblies in the corresponding information processing system node; (iii) the one or more cold plate assemblies in the corresponding information processing system node to the corresponding server return output; and (iv) and the more than one server return outputs to the server return ports of the return manifold.

Figure 17:
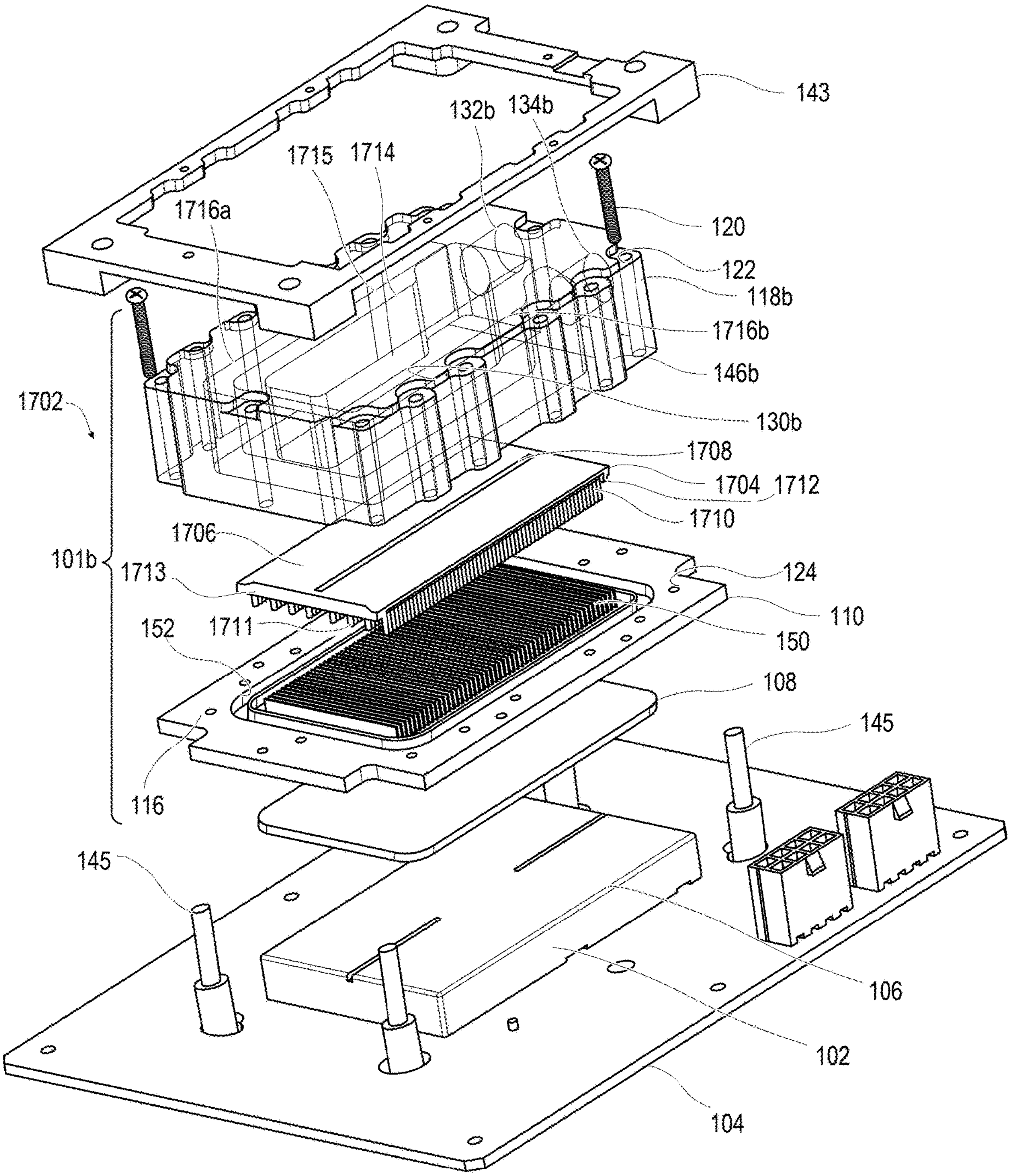
FIG. 17 presents a three-dimensional disassembled view of a cold plate assembly having an example DIRM that is configured to enable a cooling liquid flow to repeatedly impinge a surface within a channel of the cold plate to provide serial liquid impingement for cooling of the heat generating electronic component, according to one or more embodiments.

FIG. 17 presents a three-dimensional disassembled view of cold plate assembly 100*b* having distributed impingement and recovery module (DIRM) 101*b* that is configured to enable a cooling liquid flow to repeatedly impinge a surface within a channel of cold plate 110 to provide serial liquid impingement for cooling heat generating electronic component 102. Cold plate assembly 100*b* is attachable to heat generating electronic component 102 on substrate 104. DIRM 101*b* is within liquid cooling cavity 130*b* of encapsulating lid 118*b* of cold plate assembly 100*b*. At least wetted surface of DIRM 101*b* may be environmentally hardened such as by PVD coating as described above with regard to FIG. 13. Encapsulating lid 118*b* receives cooling liquid into liquid cooling cavity 130*b* through outer shell 146*b* at intake port 132*b* and returns exhaust cooling liquid at exhaust port 134*b*. DIRM 101*b*, which is within outer shell 146*b* of encapsulating lid 118*b*, includes intake manifold 1702. Intake manifold 1702 includes nozzle plate assembly 1704 having top plate 1706 that extends over the array of extended fins 150 of cold plate 110. Top plate 1706 has a first sequence of nozzle opening(s) 1708 presenting a single nozzle opening above each microchannel 201 (FIG. 2) of the plurality of microchannels 201 (FIG. 2). Single nozzle opening 1708 is configured to present a jet of cooling liquid impinging a first section of second surface 126 along a corresponding microchannel 201 (FIG. 2).

Figure 18:
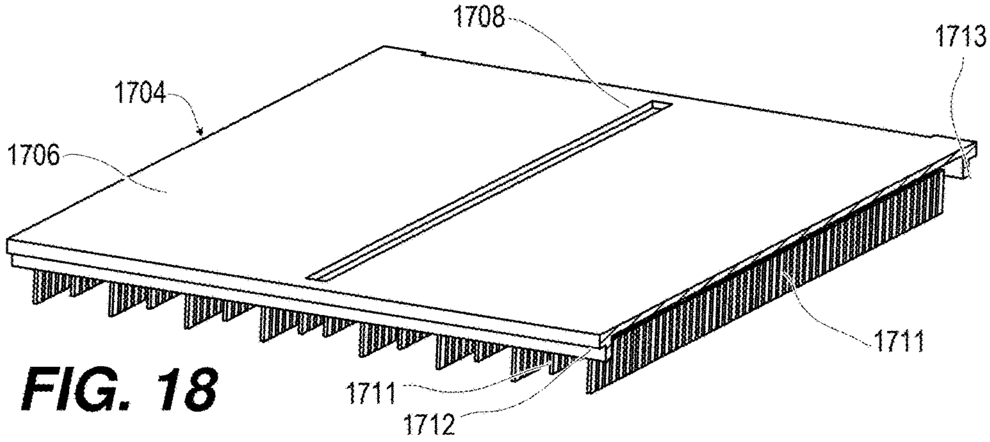
FIG. 18 is a three-dimensional view of a nozzle plate assembly of the DIRM of FIG. 17 including an arrangement of alternating upper and lower baffles extending beneath a top plate and positioned laterally inside each microchannel, according to one or more embodiments.
Figure 19:
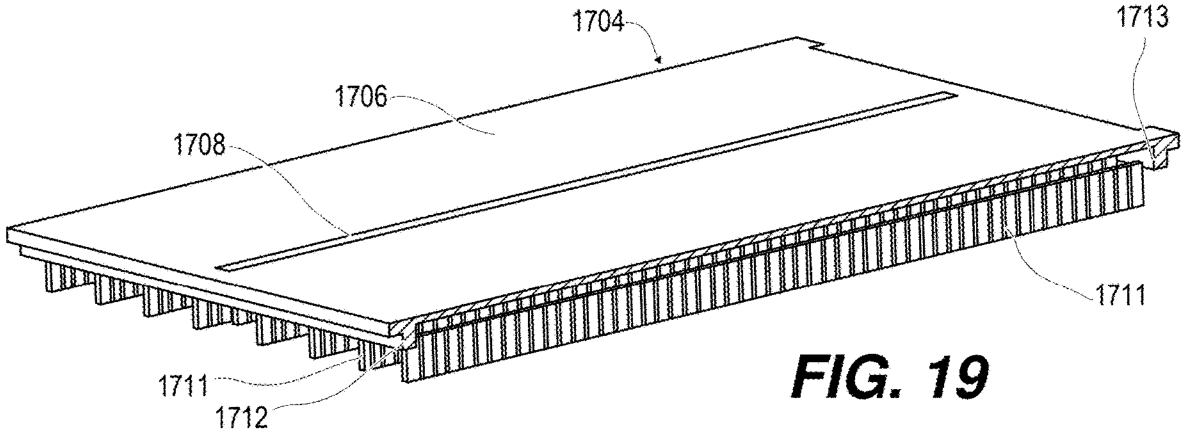
FIG. 19 is another three-dimensional view of the nozzle plate assembly of FIG. 17, according to one or more embodiments.
Figure 20:
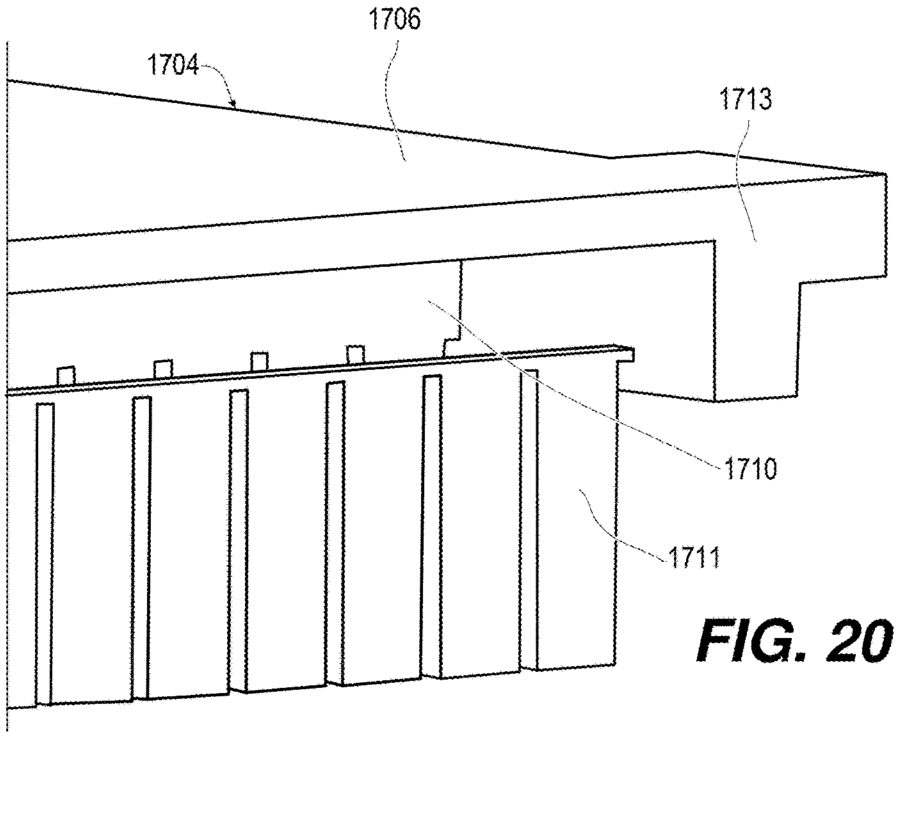
FIG. 20 is three-dimensional close-up view of the nozzle plate assembly of FIG. 17, according to one or more embodiments.
Figure 21:
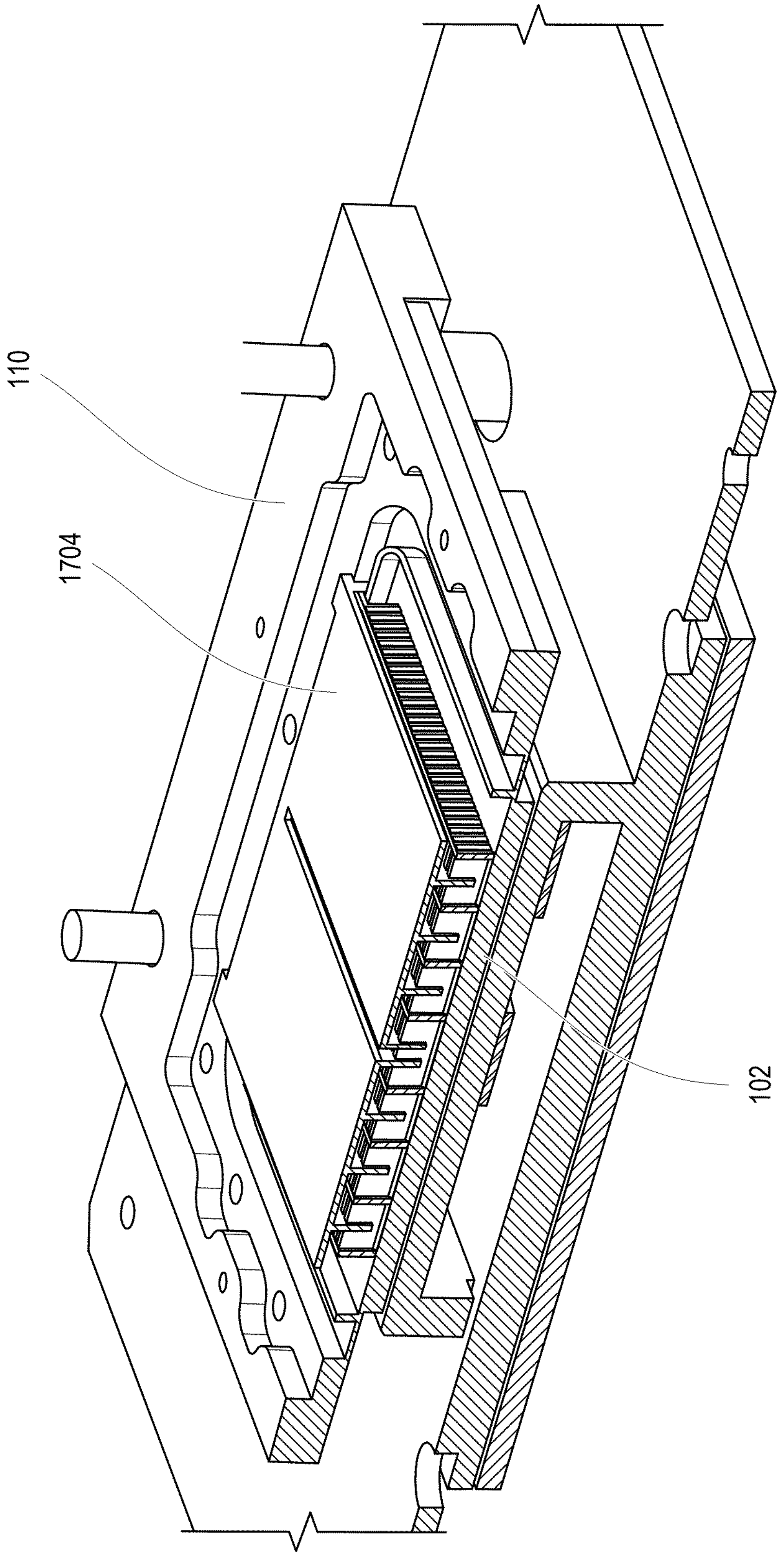
FIG. 21 is a three-dimensional cut view of the nozzle plate assembly of FIG. 17 assembled on the cold plate that is attached to heat generating component, according to one or more embodiments.

FIG. 18 is a three-dimensional view of nozzle plate assembly 1704 of DIRM 101*b*, the nozzle plate assembly 1704 including an arrangement of alternating upper and lower baffles 1710-1711 extending beneath top plate 1706 and positioned laterally inside each microchannel 201 (FIG. 2). FIG. 19 is another three-dimensional view of nozzle plate assembly 1704. FIG. 20 is three-dimensional close-up view of nozzle plate assembly 1704. With reference to FIGS. 17-20, lower baffles 1710 extend directly from top plate 1706. Lower baffles 1711 attach across lateral downward flanges 1712-1713 of nozzle plate assembly 1704. FIG. 21 is a three-dimensional cut view of nozzle plate assembly 1704 assembled on cold plate 110 that is attached to heat generating component 102.

Figure 22:
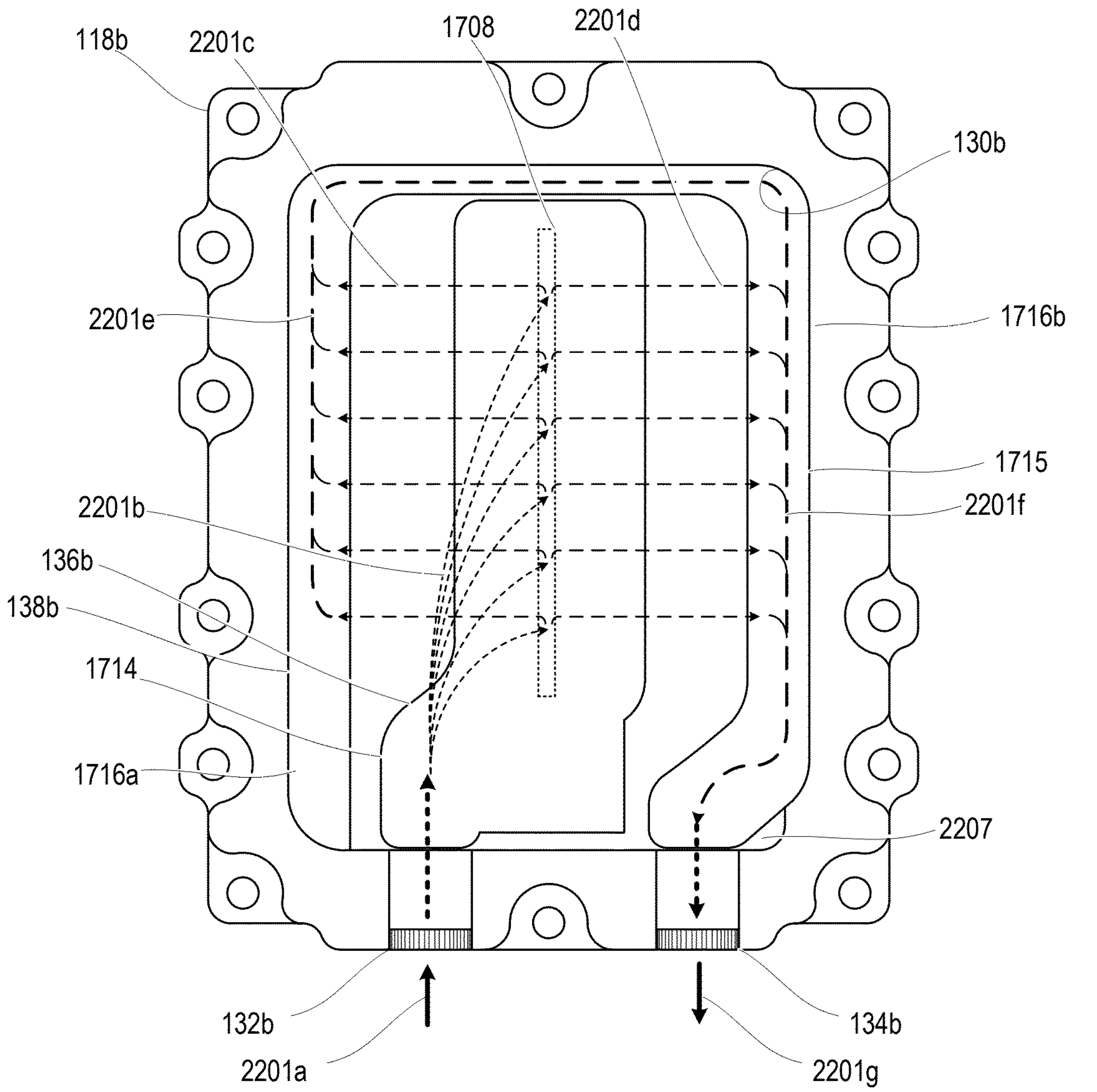
FIG. 22 presents a top transparent view of an encapsulating lid of FIG. 17, showing directional channeling of coolant liquid flows within a cooling liquid cavity of the encapsulating lid to liquid cool the cold plate, according to one or more embodiments.

FIG. 22 presents a top transparent view of encapsulating lid 118*b*, showing directional channeling of coolant liquid flows within cooling liquid cavity 130*b* of encapsulating lid 118*b* to liquid cool cold plate 110 (FIG. 1). Cooling liquid supply 2201*a* enters intake port 132*b* of encapsulating lid 118*b*. Intake conduit 1714 channels distributed supply cooling liquid 2201*b* to one or more nozzle opening 1708 of top plate 1706 (FIG. 17). In an example, nozzle opening 1708 is centrally aligned, creating lateral split (i.e., "bifurcated") flows 2201*c*-2201*d* that move in opposite directions along microchannels 201 (FIG. 2). Lateral split flow 2201*c* as depicted moves to the left into first return channel 1716*a* of return manifold 138*b* to start clockwise flow 2201*e* around peripheral portion 2207 of liquid cooling cavity 130*b*. Lateral split flow 2201*d* as depicted moves to the right into second return channel 1716*b* of return manifold 2238 to join clockwise flow 2201*f*, and the combined flows exit from exhaust port 134*b* as heated cooling liquid 2201*g*. It is appreciated that the use of two centrally located arrays of nozzle openings 1708 is one embodiment for supplying the cooling liquid to cold plate 110 (FIG. 17). It is appreciated that the use of two centrally located arrays of nozzle openings 1708 is only one embodiment for supplying the cooling liquid to the cold plate. Other methods can also provide that the intake port provide the cooling liquid to a first lateral side of the array of fins, where the cooling liquid is channeled from a first side of the microchannels to the second, opposite side of the microchannels at which the exhaust cooling liquid is collected and sent to the exhaust port.

With reference to FIG. 17, cold plate assembly 100*b* includes the following stacked components, referenced from closest to farthest away from heat generating electronic component 102: (i) two-dimensional (2D) vapor chamber 108; (ii) cold plate 110; (iii) nozzle plate assembly 1704 having top plate 1706, upper baffles 1710, and lower baffles 1711 of DIRM 101*b*; and (iv) encapsulating lid 118*b*. In one or more embodiments, within outer shell 146*b* of encapsulating lid 118*b*, DIRM 101*b* includes intake conduit 1714 sealably communicating for fluid transfer between intake port 132*b* and nozzle opening 1708. Within outer shell 146*b* of encapsulating lid 118*b*, DIRM 101*b* includes bifurcated return manifold 1715 having first and second return channels 1716*a*-1716*b* at opposed ends of the microchannels 201 (FIG. 2) along the array of extended fins 150 for collecting and channeling the exhaust cooling liquid flowing from each microchannel 201 (FIG. 2) towards exhaust port 134*b*.

With particular reference to FIG. 17, cold plate assembly 100*b* is held together by threaded fasteners 120 that pass through peripheral through holes 122 of encapsulating lid 118*b* to be received in threaded holes 124 on second surface 126 of cold plate 110. Encapsulating lid 118 is attachable to second surface 126 to form liquid cooling cavity 130. Encapsulating lid 118 includes intake port 132 and exhaust port 134. In one or more embodiments, encapsulating lid 118 has intake manifold 136*b* separated from return manifold 138*b*. When cold plate assembly 100 is assembled, intake manifold 136*b* is in fluid communication with supply flow path 142 of return port plate 116 and with intake port 132*b*. Also, return manifold 138*b* is in fluid communication with return flow paths 144 of return port plate 116 and with exhaust port 134*b*. First surface (see 1301, FIG. 13) of cold plate 110 is oriented toward heat generating electronic component 102. Cold plate assembly 100 and optional 2D vapor chamber 108 are attached to heat generating electronic component 102 by cold plate retention plate 143 being engaged to locking pins 145 extending from substrate 104.

Figure 23:
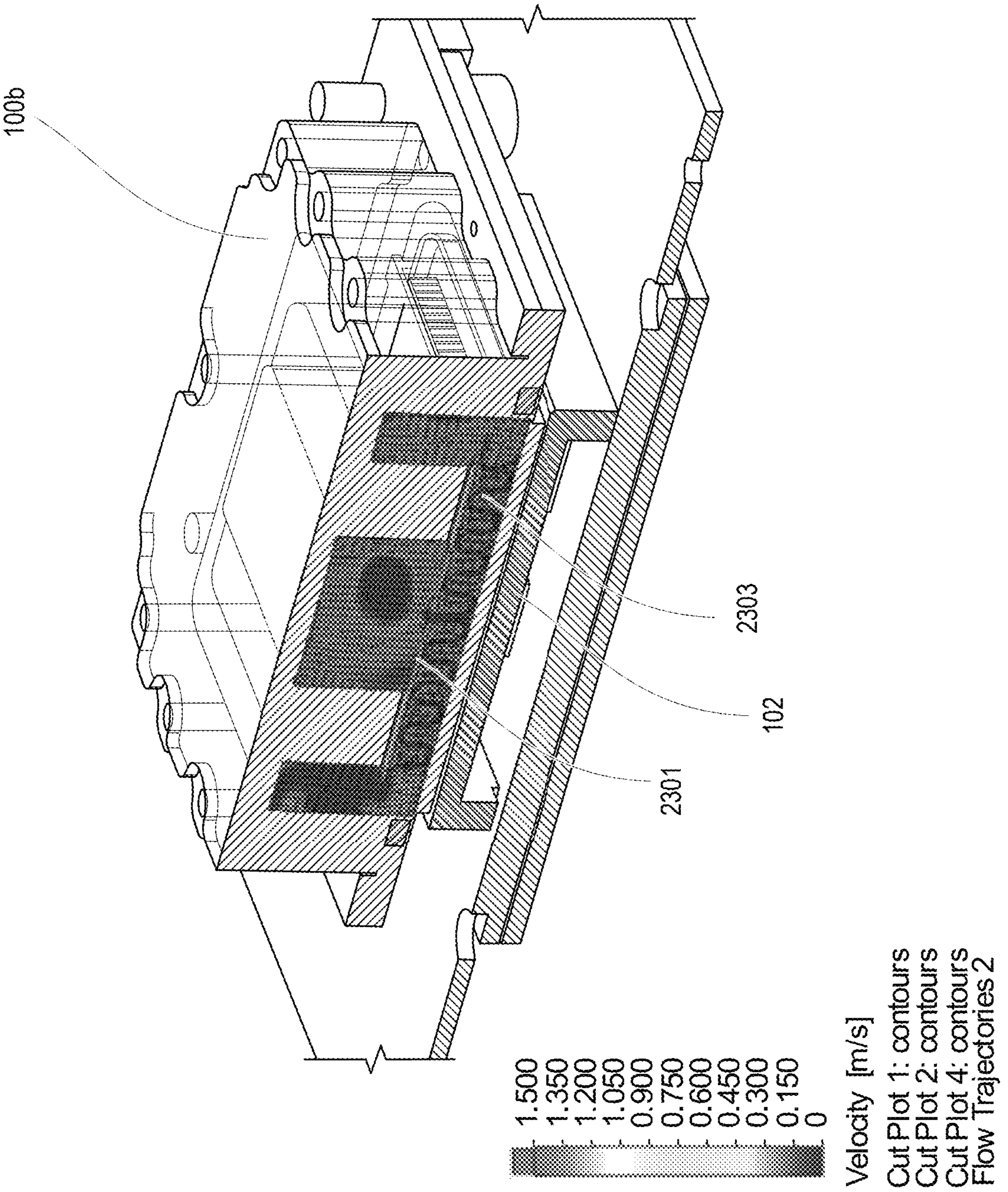
FIG. 23 is a three-dimensional cut view of the cold plate assembly of FIG. 17 attached to a heat generating electronic component and including a vertical cut plot of flow velocity of serial fluid flow along a channel, according to one or more embodiments.
Figure 24:
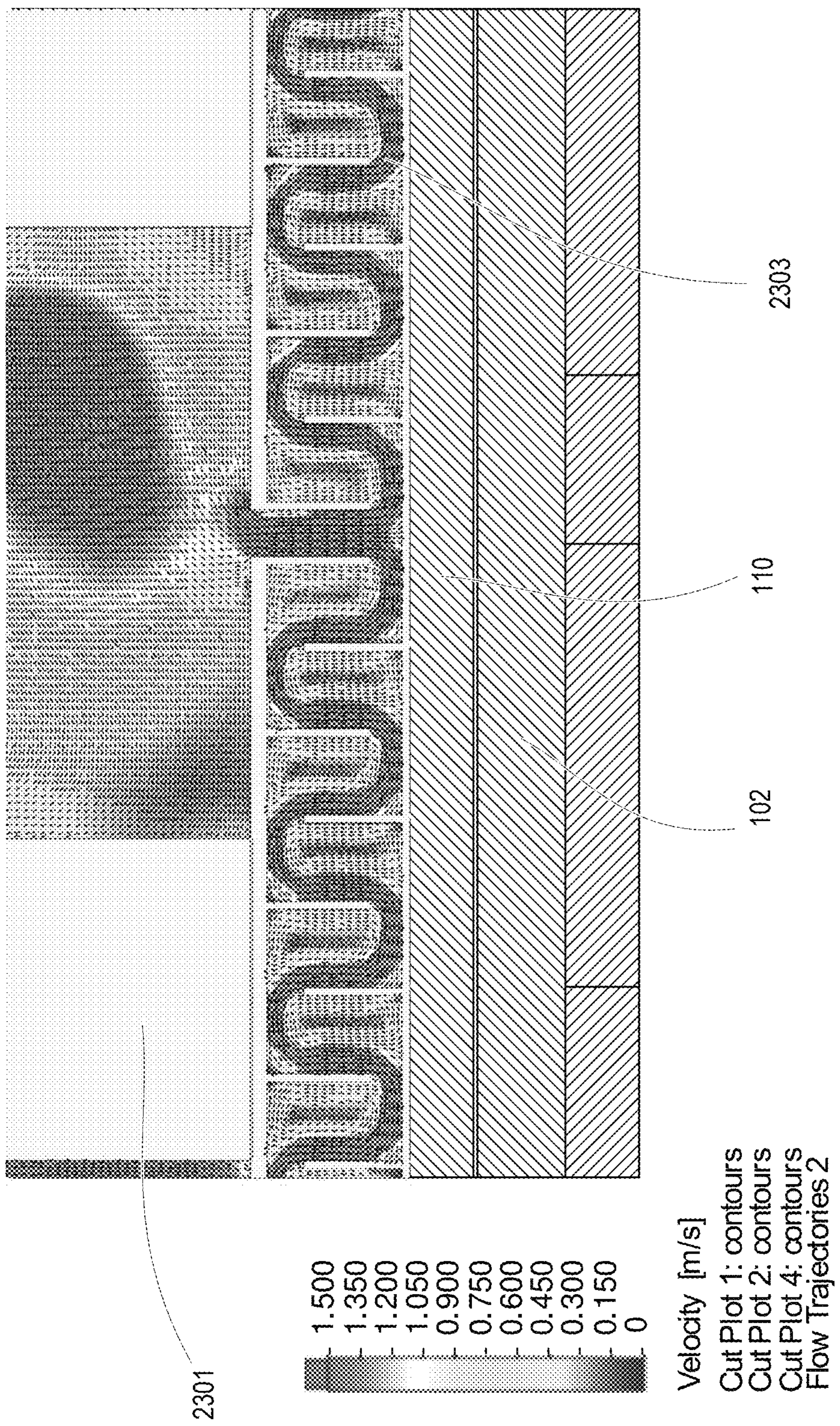
FIG. 24 presents a close up of the three-dimensional cut view of the cold plate assembly of FIG. 17, according to one or more embodiments.
Figure 25:
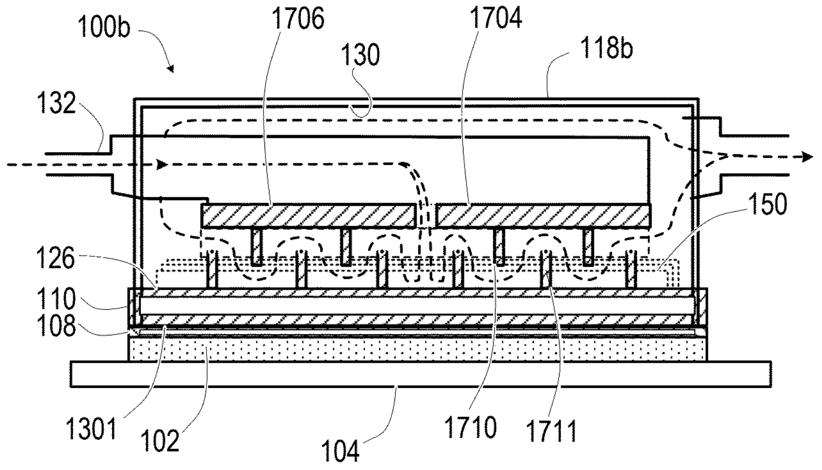
FIG. 25 is a simplified side view diagram of the cold plate assembly of FIG. 17 providing serial liquid cooling with repeating impingements of the second surface within a single channel of the cold plate, according to one or more embodiments.

FIG. 23 is a three-dimensional cut view of cold plate assembly 100*b* attached to heat generating electronic component 102 and including vertical cut plot 2301 of flow velocity of serial fluid flow 2303 along a channel. FIG. 24 presents a close-up three-dimensional cut view of cold plate assembly 100*b*. Cold plate assembly 100*b* is attached to heat generating electronic component 102. Vertical cut plot 2301 presents fluid flow velocity of serial fluid flow 2303. FIG. 25 is a simplified side view diagram of cold plate assembly 100*b* of FIG. 17 providing serial liquid cooling with repeating impingements of second surface 126 of cold plate 110. Cold plate assembly 100*b* may be supported by facility liquid cooling system 1508 (FIG. 15). With particular reference to FIG. 25, the arrangement of alternating upper and lower baffles 1710-1711 of nozzle plate assembly 1704 includes a row of upper baffles 1710 extending downwards from top plate 1706 partially into microchannels 201 (FIG. 2) toward second surface 126. The row of upper baffles 1710 is positioned laterally to microchannel 201 (FIG. 2) and causes cooling liquid to flow from a top section of top plate 1706 and upper baffle 1710 downwards to impinge second surface 126 of cold plate 110 within microchannel 201 (FIG. 2). An alternating row of lower baffles 1711 is positioned to extend upwards between adjacent extended fins 150 and redirect the impinging downward flow of cooling liquid upwards towards top plate 1706. The respective spaces presented below the upper baffles and above the lower baffles enable cooling liquid flow along microchannel 201 (FIG. 2) towards each section of bifurcated return manifold 1715, with multiple direct impingement of second surface 126 by the cooling liquid. In one or more embodiments, the first sequence of nozzle openings are presented within an elongate slot running orthogonal to the array of extended fins 150. In one or more particular embodiments, the elongate slot is positioned substantially at a midpoint above the array of extended fins 150 to generate first and second cooling liquid flows in opposite directions along microchannels 201 (FIG. 2) of the array of extended fins 150. The arrangement of alternating upper and lower baffles includes a first section of upper and lower baffles 1710-1711 located along a first segment of microchannels 201 (FIG. 2) on a first side of nozzle opening and a second section of upper and lower baffles along a second segment of the microchannels on an opposed, second side of the nozzle opening. In one or more embodiments, cold plate assembly 100*b* may be part of IPS 1502 as described in FIG. 15, as an alternative or in addition to cold plate 110*a*.

Figure 26:
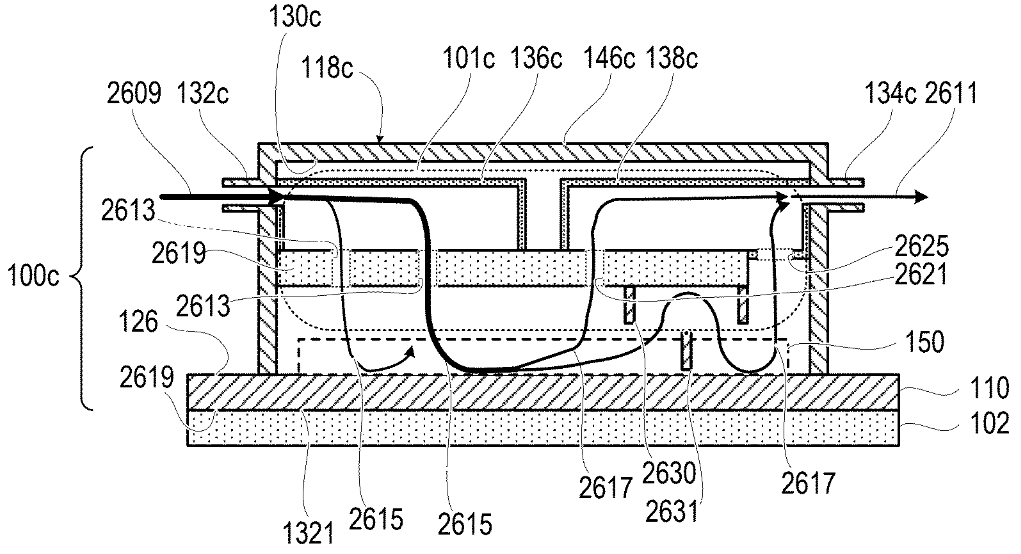
FIG. 26 is a simplified diagram of a cold plate assembly having a generalized DIRM that liquid cools the heat generating electronic component and which summarizes aspects of the preceding figures, according to one or more embodiments.

FIG. 26 is a simplified diagram of example cold plate assembly 100*c* having distributed impingement and recover module (DIRM) 101*c*. In one or more embodiments, DIRM 101*c* may be a generalized implementation that summarizes aspects of the preceding figures. Cold plate assembly 100*c* may be supported by facility liquid cooling system 1508 (FIG. 15). Cold plate assembly 100*c* includes cold plate 110 manufactured of a thermally conductive material. Cold plate assembly 100*c* has first surface 1321 attachable to heat generating electronic component 102 and second surface 126 opposite to first surface 1321 and having an array of extended fins 150 that facilitate heat transfer from attached heat generating electronic component 102 via a cooling liquid flow. Cold plate assembly 100*c* includes encapsulating lid 118*c* attachable to second surface 126 to form liquid cooling cavity 130*c*. Encapsulating lid 118*c* includes intake port 132*c* for receiving cooling liquid flow 2609 from a cooling liquid source. Encapsulating lid 118*c* includes exhaust port 134*c* for expelling exhaust cooling liquid 2611 provided from multiple impingements of the received cooling liquid on second surface 126 of cold plate 110. DIRM 101*c* is positioned within liquid cooling cavity 130*c* of encapsulating lid 118*c* above second surface 126 of cold plate 110. DIRM 101*c* includes intake manifold 136*c* presenting at least one sequence of nozzle openings 2613 in fluid communication with intake port 132*c*. Each nozzle opening 2613 provides direct impingement by nozzle jet 2615 of a portion of cooling liquid on at least one corresponding section of second surface 126. In an example, multiple nozzle openings 2613 create multiple nozzle jets 2615 that result in multiple impingements. Alternatively, or in addition, DIRM 101*c* may include upper and lower baffles 2630-2631 to channel at least one nozzle jet 2615 to serially impinge different locations on second surface 126 (i.e., "multiple impingements"). DIRM 101*c* includes return manifold 138*c* in fluid communication with exhaust port 134*c*. Return manifold 138*c* facilitates a return of converging exhaust cooling liquid 2617 to exhaust port 134*c* following at least one direct impingement of the portion of cooling liquid onto the at least one corresponding section to provide distributed, localized impingement cooling at corresponding sections of cold plate 110. In one or more embodiments, DIRM 101*c* includes plate 2619 having at least one nozzle opening 2613 and at least one return orifice 2621 that communicates with return manifold 138*c*. Alternatively, or in addition, converging exhaust cooling liquid 2617 passes laterally out from between plate 2619 and cold plate 110 to enter return manifold 138*c* via manifold opening 2625. Intake manifold 136*c* and return manifold 138*c* of DIRM 101*c* may be separate components or may be attached to outer shell 146*c* of encapsulating lid 118*c*.

Figure 27:
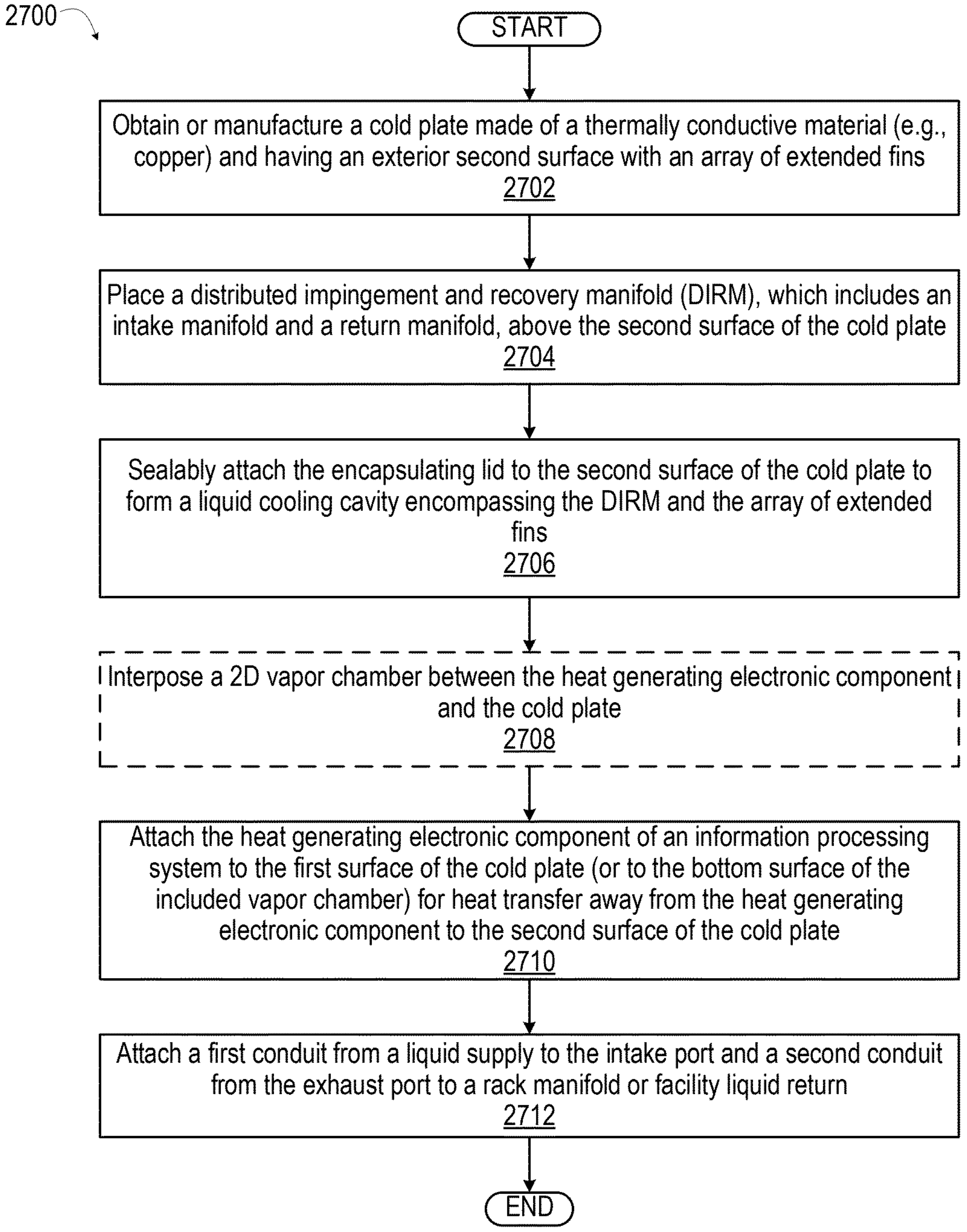
FIG. 27 is a flow diagram presenting a method of manufacturing a cold plate assembly for providing liquid cooling of heat generating electronic components with a generalized DIRM, according to one or more embodiments.
Figure 28:
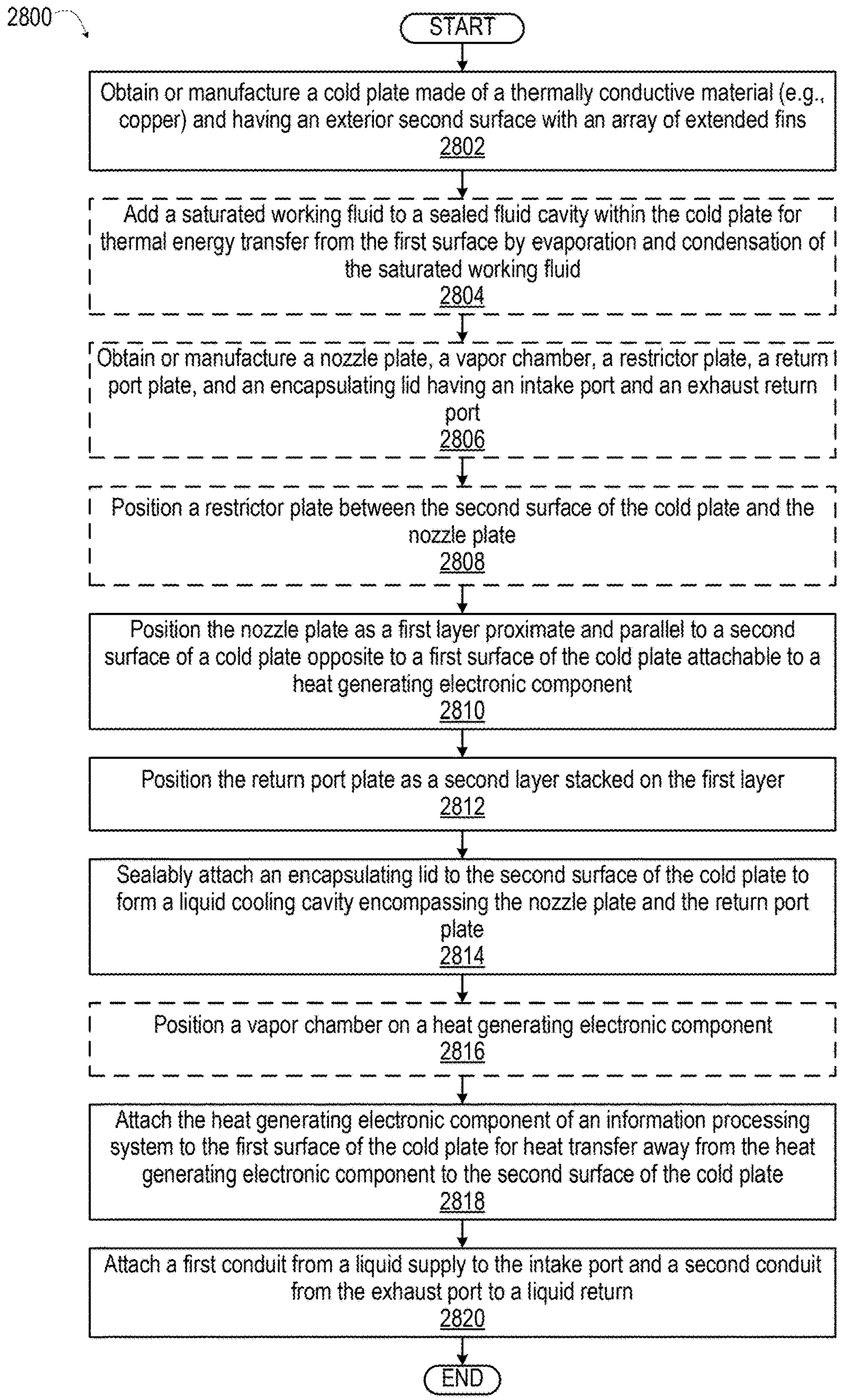
FIG. 28 is a flow diagram presenting a method of manufacturing a cold plate assembly for providing liquid cooling of heat generating electronic components with localized surface cooling, according to one or more embodiments.
Figure 29:
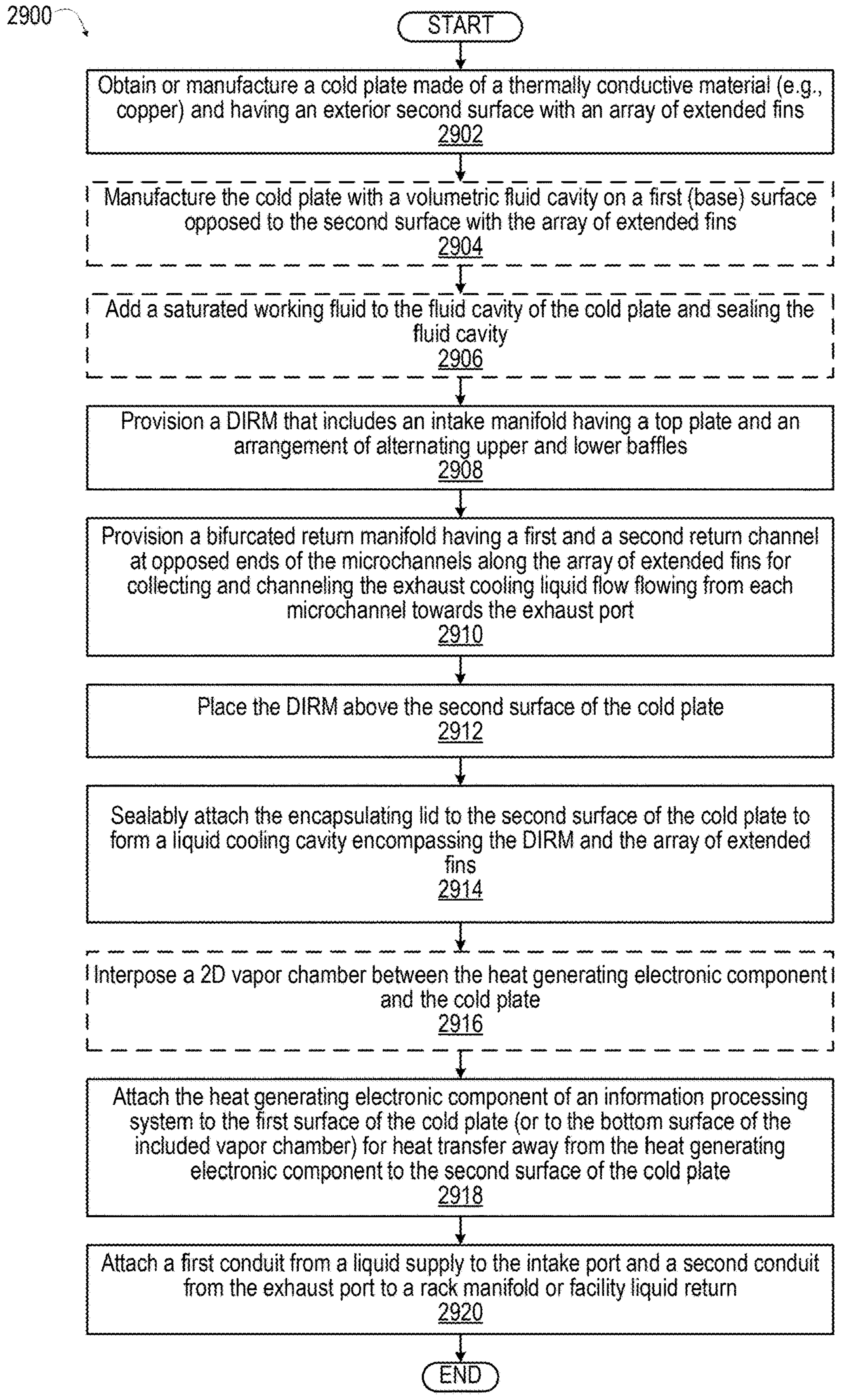
FIG. 29 is a flow diagram presenting a method of manufacturing a cold plate assembly for providing liquid cooling of heat generating electronic components with serial surface impingement for cooling along the microchannels, according to one or more embodiments.
Figure 30:
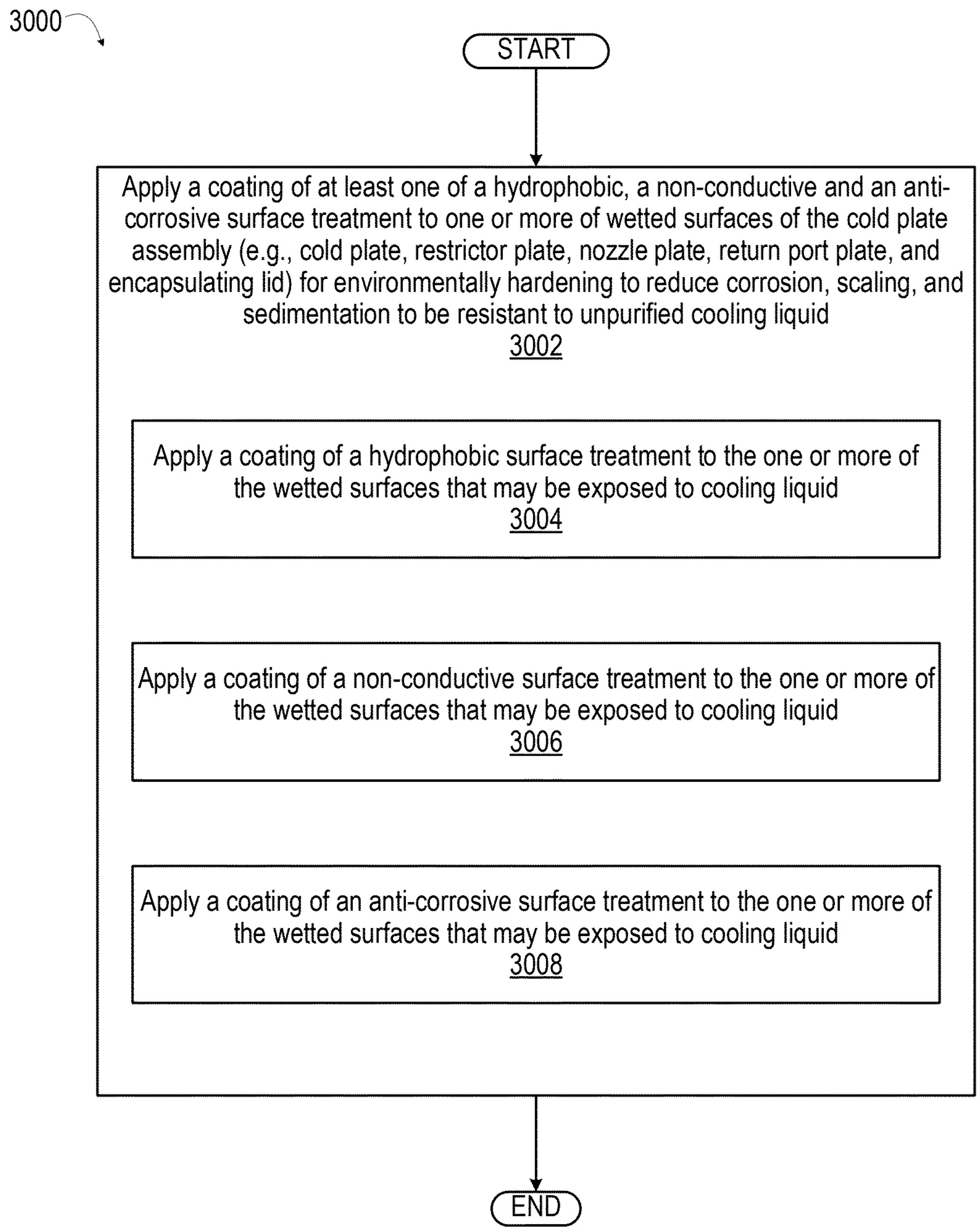
FIG. 30 is a flow diagram presenting a method that augments the methods of FIGS. 27-29 to environmentally hardening wetted surfaces of the cold plate assembly that may be exposed to cooling liquid to enable utilizing facility liquid for liquid cooling of heat generating electronic components without experiencing issues of fouling or clogging, according to one or more embodiments.
Figure 31:
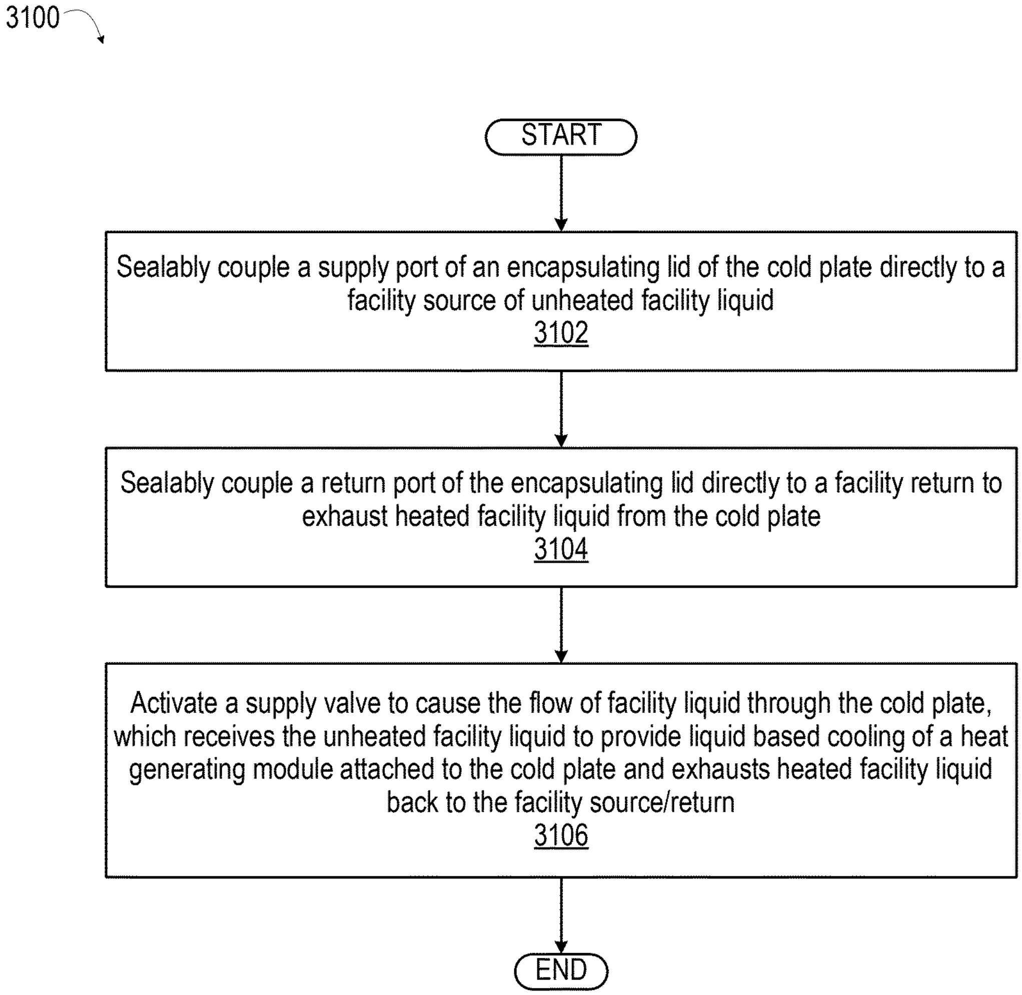
FIG. 31 is a flow diagram presenting a method of using a cold plate assembly to liquid cool heat generating components of an information processing system.

FIG. 27 is a flow diagram presenting method 2700 of manufacturing a cold plate assembly for providing liquid cooling of heat generating electronic components with a generalized DIRM. In an example, method 2700 may be performed to produce cold plate assembly 100*a* of FIG. 15, cold plate assembly 100*b* of FIG. 17, or cold plate assembly 100*c* of FIG. 26. FIG. 28 is a flow diagram presenting method 2800 of manufacturing a cold plate assembly for providing liquid cooling of heat generating electronic components with localized surface cooling. In an example, method 2800 may be performed to produce cold plate assembly 100 of FIGS. 1-13 or cold plate assembly 100*a* of FIG. 15. FIG. 29 is a flow diagram presenting method 2900 of manufacturing a cold plate assembly for providing liquid cooling of heat generating electronic components with serial surface impingement of cooling liquid within the microchannels. In an example, method 2900 may be performed to produce cold plate assembly 100*b* of FIGS. 17-24. FIG. 30 is a flow diagram presenting method 3000 that augments methods 2700 (FIG. 27), 2800 (FIG. 28), and 2900 (FIG. 29), by environmentally hardening wetted surfaces of the cold plate assembly that may be exposed to cooling liquid to enable utilizing facility liquid for liquid cooling of heat generating electronic components without experiencing issues of fouling or clogging. FIG. 31 is a flow diagram presenting method 3100 of using a cold plate assembly to liquid cool heat generating components of an information processing system. The descriptions of methods 2700 (FIG. 27), 2800 (FIG. 28), 2900 (FIG. 29), 3000 (FIG. 30), and 3100 (FIG. 31) are provided with general reference to the specific components illustrated within the preceding FIGS. 1-26. Specific components referenced in methods 2700 (FIG. 27), 2800 (FIG. 28), 2900 (FIG. 29), 3000 (FIG. 30), and 3100 (FIG. 31) may be identical or similar to components of the same name used in describing preceding FIGS. 1-26. In one or more embodiments, an assembly controller of an automated control system or a similar computing device provides the described functionality of method methods 2700 (FIG. 27), 2800 (FIG. 28), 2900 (FIG. 29), 3000 (FIG. 30), and 3100 (FIG. 31).

With reference to FIG. 27, in one or more embodiments, method 2700 optionally includes obtaining or manufacturing a cold plate made of a thermally conductive material (e.g., copper) and having an exterior second surface with an array of extended fins (block 2702). The array of extended fins facilitate heat transfer from the attached heat generating electronic component via a cooling liquid flow. The first surface of the cold plate is a thermal energy receiving surface and the second surface of the cold plate is a thermal energy transferring surface. Method 2700 includes placing a distributed impingement and recovery manifold (DIRM), which includes an intake manifold and a return manifold, above the second surface of the cold plate (block 2704). The intake manifold presents at least one sequence of nozzle openings in fluid communication with a cooling liquid intake port of an encapsulating lid. Each nozzle opening provides direct impingement of a portion of cooling liquid on at least one corresponding section of the second surface of the cold plate. The return manifold is in fluid communication with an exhaust port of the encapsulating lid. The return manifold facilitates a return of exhaust cooling liquid to the exhaust port following at least one direct impingement of the portion of cooling liquid onto the at least one corresponding section to provide distributed, localized impingement cooling at corresponding sections of the cold plate. Method 2700 includes sealably attaching the encapsulating lid to the second surface of the cold plate to form a liquid cooling cavity encompassing the DIRM and the array of extended fins (block 2706). The intake port of the encapsulating lid receives cooling liquid flow from a cooling liquid source. The intake port is in fluid communication with the intake manifold. The exhaust port of the encapsulating lid expels exhaust cooling liquid provided from impingements of the received cooling liquid on the second surface of the cold plate. The exhaust port is in fluid communication with the return manifold.

With the cold plate assembly completed, method 2700 may optionally include interposing a 2D vapor chamber between the heat generating electronic component and the cold plate (block 2708). Method 2700 includes attaching the heat generating electronic component of an information processing system to the first surface of the cold plate (or to the bottom surface of the included vapor chamber) for heat transfer away from the heat generating electronic component to the second surface of the cold plate (block 2710). The working fluid in the 2D vapor chamber laterally distributes and vertically transfers thermal energy more efficiently than a solid thermal conduction material. As compared to lateral dimensions, the 2D vapor chamber may be relatively thin and thus is referred herein as "2D". The 2D vapor chamber does include sufficient vertical space to facilitate lateral distribution and vertical transfer of thermal energy. The resulting heat generating electronic component can then be liquid cooled during operation by attaching a first conduit from a liquid supply to the intake port and a second conduit from the exhaust port to a rack manifold or facility liquid return (block 2712). Then, method 2700 ends.

In one or more embodiments, the cold plate is manufactured by utilizing copper as the thermally conductive material. The first surface of the cold plate is a heat receiving surface for attaching to a heat generating electronic component directly, or indirectly through an attached vapor chamber. The second surface of the cold plate is a heat transfer surface. In one or more embodiments, in manufacturing the cold plate, method 2700 further includes configuring the fin stack with the levels of fins spaced apart at least 800-microns to facilitate passage of the facility liquid particulates. In one or more embodiments, in manufacturing the encapsulating lid of the cold plate assembly, method 2700 further includes configuring the intake port, exhaust port, and volumetric space of the liquid cooling cavity to maintain a flow velocity of at least 0.7 m/s of liquid impinging the fin stack to prevent sedimentation.

With reference to FIG. 28, in one or more embodiments, method 2800 optionally includes obtaining or manufacturing a cold plate made of a thermally conductive material (e.g., copper) and having an exterior second surface with an array of extended fins (block 2802). Method 2800 may include manufacturing the cold plate with a volumetric fluid cavity on a first (base) surface opposed to the second surface with the array of extended fins (block 2804). Method 2800 may include adding a saturated working fluid to the fluid cavity of the cold plate and sealing the fluid cavity to provide thermal energy transfer from a heated first surface by evaporation and condensation of the saturated working fluid to a second surface juxtaposed to the base (first) surface of the cold plate (block 2806). In one or more embodiments, method 2800 includes obtaining or manufacturing a nozzle plate, a 2D vapor chamber, optionally a restrictor plate, a return port plate, and an encapsulating lid having an intake port and an exhaust return port (block 2806). The nozzle plate has a plurality of through holes. In one or more embodiments, the nozzle plate includes parallel rows of nozzle holes.

Prior to positioning the nozzle plate and the return port plate, method 2800 includes optionally positioning a restrictor plate between the second surface of the cold plate and the nozzle plate (block 2808). According to one embodiment, the specific configuration and subsequent placement of the restrictor plate are determined based on the type and heat dissipating characteristics of the heat generating electronic component to which the cold plate is intended to be utilized. Manufacturing and/or using different configurations of restrictor plates enables a single form of cold plate to be utilized with several different types of heat generating electronic components. Method 2800 includes positioning the nozzle plate as a first layer (assuming non-use of a restrictor plate) proximate and parallel to a second surface of a cold plate opposite to a first surface of the cold plate attachable to a heat generating electronic component (block 2810). Method 2800 includes positioning the return port plate as a second layer stacked on the first layer (block 2812).

The return port plate has (i) more than one supply flow paths that channel supply liquid from the intake port to a first subset of the plurality of through holes in the nozzle plate that function as nozzle orifices and (ii) one or more return flow paths, adjacent to a respective supply flow path, that channel exhaust liquid from a second subset of the through holes of the plurality of through holes that function as return orifices to the exhaust port. The second subset of through holes is exclusive of the first subset. One or more nozzle orifices are located proximate to one or more return orifices create localized cooling flow paths with localized recovery of the cooling liquid that disrupts a thermal boundary layer at the second surface of the cold plate. If present, the restrictor plate blocks a third subset of the nozzle holes that are not required to liquid cool the cold plate while leaving other nozzle holes unblocked for selective impingement of the cooling liquid on higher heat emitting surface areas of the heat generating electronic component.

In one or more embodiments, the return port plate includes a baffle of alternating supply and return flow paths. The encapsulating lid includes an intake manifold separated from an exhaust manifold by the return port plate. The intake manifold is in fluid communication with the supply flow paths and with the intake port. The exhaust manifold is in fluid communication with the return flow paths and with the exhaust port. In one or more embodiments, method 2800 includes configuring the adjacent pairings of nozzle and return ports to create localized cooling flow paths to disrupt a thermal boundary layer of the cooling liquid proximate to the second surface of the cold plate.

Method 2800 includes sealably attaching an encapsulating lid to the second surface of the cold plate to form a sealed liquid cooling cavity encompassing the nozzle plate and the return port plate (block 2814). Sealably attaching the encapsulating lid to the cold plate may include use of one or more of a press-fit interference attachment, adhering with an adhesive or adhesive layer, soldering, brazing, welding, and fastener attachment. The encapsulating lid forms a liquid cooling cavity and includes an intake port and an exhaust port for coupling (for supply and return) to a facility liquid source.

With the cold plate assembly completed, method 2800 may optionally include positioning a 2D vapor chamber between a heat generating electronic component and the first surface of the cold plate (block 2816). Method 2800 includes attaching the heat generating electronic component of an information processing system to the first surface of the cold plate (or to the bottom surface of the included vapor chamber) for heat transfer away from the heat generating electronic component to the second surface of the cold plate (block 2818). The 2D vapor chamber, if included, is interposed between the heat generating electronic component and the cold plate. The phase change of the working fluid in the 2D vapor chamber laterally distributes and vertically transfers thermal energy more efficiently than a solid thermal conduction material. As compared to lateral dimensions, the 2D vapor chamber may be relatively thin and thus is referred herein as "2D". The 2D vapor chamber does include sufficient vertical space to facilitate lateral distribution and vertical transfer of thermal energy. The resulting heat generating electronic component can then be liquid cooled during operation by attaching a first conduit from a liquid supply to the intake port and a second conduit from the exhaust port to a rack manifold or facility liquid return (block 2820). Then, method 2800 ends.

In one or more embodiments, the cold plate is manufactured by utilizing copper as the thermally conductive material. The first surface of the cold plate is a heat receiving surface for attaching to a heat generating electronic component directly, or indirectly through an attached vapor chamber. The second surface of the cold plate is a heat transfer surface. In one or more embodiments, in manufacturing the cold plate, method 2800 further includes configuring the fin stack with the levels of fins spaced apart at least 800-microns to facilitate passage of the facility liquid particulates. In one or more embodiments, in manufacturing the encapsulating lid of the cold plate assembly, method 2800 further includes configuring the intake port, exhaust port, and volumetric space of the liquid cooling cavity to maintain a flow velocity of at least 0.7 m/s of liquid impinging the fin stack to prevent sedimentation.

With reference to FIG. 29, in one or more embodiments, method 2900 includes obtaining or manufacturing a cold plate made of a thermally conductive material (e.g., copper) and having an exterior second surface with an array of extended fins (block 2902). The array of extended fins facilitate heat transfer from the attached heat generating electronic component via a cooling liquid flow. The first surface of the cold plate is a thermal energy receiving surface and the second surface of the cold plate is a thermal energy transferring surface. Method 2900 optionally includes manufacturing the cold plate with a volumetric fluid cavity on a first (base) surface opposed to the second surface with the array of extended fins (block 2904). Method 2900 optionally includes adding a saturated working fluid to the fluid cavity of the cold plate and sealing the fluid cavity (block 2906). The saturated working fluid provides thermal energy transfer from a heated first surface by evaporation and condensation of the saturated working fluid to a second surface juxtaposed to the base (first) surface of the cold plate.

Method 2900 includes provisioning a DIRM that includes an intake manifold having a top plate and an arrangement of alternating upper and lower baffles (block 2908). The top plate is configured to extend over the array of extended fins and having a first sequence of nozzle openings presenting a single nozzle opening above each microchannel of the plurality of microchannels. The single nozzle opening presents a jet of cooling liquid impinging a first section of the second surface along a corresponding microchannel. The arrangement of alternating upper and lower baffles extend beneath the top plate and are positioned laterally inside each microchannel to cause alternating upwards and downwards flow of the cooling liquid impinging at the first section within the microchannel. Each downwards flow causes the cooling liquid to impinge a next section of the second surface within the microchannel. Each impingement of the cooling liquid on sections of the microchannel results in an increased liquid heat transfer coefficient at the second surface. Method 2900 includes provisioning a bifurcated return manifold having a first and a second return channel at opposed ends of the microchannels along the array of extended fins for collecting and channeling the exhaust cooling liquid flow flowing from each microchannel towards the exhaust port (block 2910).

Method 2900 includes placing the DIRM above the second surface of the cold plate (block 2912). The intake manifold presents at least one sequence of nozzle openings in fluid communication with a cooling liquid intake port of an encapsulating lid. Each nozzle opening provides direct impingement of a portion of cooling liquid on at least one corresponding section of the second surface of the cold plate. The return manifold is in fluid communication with an exhaust port of the encapsulating lid. The return manifold facilitates a return of exhaust cooling liquid to the exhaust port following at least one direct impingement of the portion of cooling liquid onto the at least one corresponding section to provide distributed, localized impingement cooling at corresponding sections of the cold plate. Method 2900 includes sealably attaching the encapsulating lid to the second surface of the cold plate to form a liquid cooling cavity encompassing the DIRM and the array of extended fins (block 2914). The comprising The intake port of the encapsulating lid receives cooling liquid flow from a cooling liquid source. The intake port is in fluid communication with the intake manifold. The exhaust port of the encapsulating lid expels exhaust cooling liquid provided from impingements of the received cooling liquid on the second surface of the cold plate. The exhaust port is in fluid communication with the return manifold.

With the cold plate assembly completed, method 2900 may optionally include interposing a 2D vapor chamber between the heat generating electronic component and the cold plate (block 2916). Method 2900 includes attaching the heat generating electronic component of an information processing system to the first surface of the cold plate (or to the bottom surface of the included vapor chamber) for heat transfer away from the heat generating electronic component to the second surface of the cold plate (block 2918). The working fluid in the 2D vapor chamber laterally distributes and vertically transfers thermal energy more efficiently than a solid thermal conduction material. The resulting heat generating electronic component can then be liquid cooled during operation by attaching a first conduit from a liquid supply to the intake port and a second conduit from the exhaust port to a rack manifold or facility liquid return (block 2920). Then, method 2900 ends.

With reference to FIG. 30, method 3000 may further include applying a coating of at least one of a hydrophobic, a non-conductive and an anti-corrosive surface treatment to one or more of wetted surfaces of the cold plate assembly (e.g., cold plate, restrictor plate, nozzle plate, return port plate, and encapsulating lid) for environmentally hardening of the surfaces to reduce corrosion, scaling, and sedimentation to be resistant to chemical impurities and particulates within unpurified cooling liquid (block 3002). In an example, method 3000 includes applying a coating of a hydrophobic surface treatment to the one or more of the wetted surfaces that may be exposed to cooling liquid (block 3004). In another example, method 3000 includes applying a coating of a non-conductive surface treatment to the one or more of the wetted surfaces that may be exposed to cooling liquid (block 3006). In an additional example, method 3000 includes applying a coating of an anti-corrosive surface treatment to the one or more of the wetted surfaces that may be exposed to cooling liquid (block 3008). The coating protects the surface material and thereby allows direct use of facility liquid or facility-grade liquid that may contain corrosive chemical or clogging particulates. With the use of environmentally hardened or coated cold plate assembly (100), isolating the facility liquid in a separate cooling loop from a secondary coolant loop that directly cools the heat generating component is not required. The facility liquid provides direct liquid transfer of heat from a heat generating component to which the cold plate is attached. The coating avoids or mitigates corrosion and clogging of the cold plate due to facility liquid chemicals and/or particulates. Then, method 3000 ends.

In one or more embodiments, as presented in blocks 3004, 3006, and 3008, applying the coating may include only one of the three characteristics (i.e., hydrophobic, non-conductive, and anti-corrosive) in a coating, two of the three characteristics in the coating, or all three of the characteristics in a coating. In one or more embodiments, as presented in blocks 3004, 3006, and 3008, applying the coating may further include coating the one or more of the wetted surfaces that may be exposed to cooling liquid with more than one coating of surface treatment, each coating providing one or more of the three characteristics. In one or more embodiments, as presented in block 3004, coating the one or more of the wetted surfaces that may be exposed to cooling liquid includes applying a hydrophobic layer to prevent scaling and sedimentation due to dissolved calcium carbonate in the facility liquid. In one or more embodiments, method 3000 further includes coating the one or more of the wetted surfaces that may be exposed to cooling liquid using physical vapor deposition (PVD). In one or more embodiments, method 3000 further includes coating the one or more of the wetted surfaces that may be exposed to cooling liquid, via PVD, with one or more ceramics from among a group comprising Zirconium Nitride and Titanium Nitride.

With reference to FIG. 31, method 3100 includes sealably coupling a supply port of an encapsulating lid of the cold plate directly (or indirectly through a supply manifold) to a cooling liquid source of unheated facility liquid (block 3102). Method 3100 includes sealably coupling a return port of the encapsulating lid directly (or indirectly through a return manifold) to a facility return to exhaust heated facility liquid from the cold plate (block 3104). Method 3100 includes activating a supply valve to cause the flow of facility liquid through the cold plate, which receives the unheated facility liquid to provide liquid based cooling of a heat generating electronic component attached to the cold plate and directs the heated facility liquid back to the cooling liquid source or to a cooling liquid return (block 3106). Then, method 3100 ends.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "component", "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device, or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. A cold plate assembly comprising:

a cold plate comprised of a thermally conductive material and having a first surface attachable to a heat generating electronic component and a second surface opposite to the first surface and having an array of fins that facilitate heat transfer from the attached heat generating electronic component via a cooling liquid flow;

an encapsulating lid attachable to the second surface to form a liquid cooling cavity and comprising: (i) an intake port for receiving cooling liquid flow from a cooling liquid source; and (ii) an exhaust port for expelling exhaust cooling liquid provided from impingements of the received cooling liquid on the second surface of the cold plate; and a distributed impingement and recovery manifold (DIRM) positioned within the liquid cooling cavity of the encapsulating lid above the second surface of the cold plate, the DIRM comprising: (i) an intake manifold presenting at least one sequence of nozzle openings in fluid communication with the intake port, each nozzle opening providing direct impingement of a portion of cooling liquid on at least one corresponding section of the second surface; (ii) a return manifold in fluid communication with the exhaust port and which facilitates a return of exhaust cooling liquid to the exhaust port following at least one direct impingement of the portion of cooling liquid onto the at least one corresponding section to provide distributed, localized impingement cooling at corresponding sections of the cold plate; (iii) a nozzle plate positioned as a first layer proximate and parallel to the second surface and having the at least one sequence of nozzle openings comprising a plurality of through holes configured to create respective jets of cooling liquid that impinge the second surface; and (iv) a return port plate positioned as a second layer stacked on the nozzle plate and having more than one supply flow paths that channel supply liquid from the intake port to a first subset of the plurality of through holes in the nozzle plate that function as nozzle orifices and having one or more return flow paths, adjacent to a respective supply flow path, that channel exhaust cooling liquid from a second subset of the plurality of through holes that function as return orifices to the exhaust port, the second subset being exclusive of the first subset, with one or more nozzle orifices being located proximate to one or more return orifices creating localized cooling flow paths with localized recovery of the cooling liquid that disrupt a thermal boundary layer at the second surface of the cold plate.

2. The cold plate assembly of claim 1, further comprising a restrictor plate positionable between the second surface of the cold plate and the nozzle plate to block a third subset of the nozzle through holes that are not required to liquid cool the heat generating electronic component while leaving respective portions of the first subset and the second subset of the plurality of nozzle through holes unblocked for selective impingement of the cooling liquid on higher heat emitting surface areas of the heat generating electronic component.

3. The cold plate assembly of claim 1, wherein:

the nozzle plate comprises parallel rows of nozzle through holes;

the return port plate comprises a baffle of alternating supply and return flow paths aligned with respective rows of nozzle through holes; and the encapsulating lid has an intake manifold separated from a return manifold by the return port plate, the intake manifold in fluid communication with the supply flow paths and with the intake port, and the return manifold in fluid communication with the return flow paths and with the exhaust port.

4. The cold plate assembly of claim 3, wherein one of the supply and return flow paths of the return port plate comprises downwardly open channels that sealably contact the nozzle plate on each side of a corresponding at least one first row of the nozzle through holes of the nozzle plate, contact portions of the return port plate adjacent to the downwardly open channel configured to sealably contact around a corresponding at least one second row of the nozzle through holes of the nozzle plate, the contact portions having one or more openings aligned with the second row of the nozzle through holes to fluidly communicate with the liquid cooling cavity under the encapsulating lid.

5. The cold plate assembly of claim 1, wherein adjacent pairings of nozzle and return ports create localized cooling flow paths proximate to the second surface of the cold plate to disrupt a thermal boundary layer of the cooling liquid proximate to the cold plate.

6. The cold plate assembly of claim 1, wherein at least one of: (i) the second surface of the cold plate; (ii) the liquid cooling cavity of the encapsulating lid; (iii) the nozzle plate; and (iv) the return port plate is coated with at least one material that is one or more of hydrophobic, non-conductive, and anti-corrosive to enable use of facility water as a cooling liquid.

7. The cold plate assembly of claim 1, wherein each of the at least one corresponding section of the second surface of the cold plate is impacted by a substantially perpendicular impingement of the portion of the cooling liquid.

8. The cold plate assembly of claim 1, further comprising a two-dimensional vapor chamber positioned between the heat generating electronic component and the cold plate.

9. The cold plate assembly of claim 1, wherein the DIRM comprises:

a supply manifold system sealably connected for liquid transfer from the intake port to a first subset of the at least one sequence of nozzle openings comprising a plurality of through holes in the nozzle plate configured to create a corresponding plurality of nozzle jets that impinges the array of extended fins; and a return manifold system sealably connected for liquid transfer to the exhaust port from a second subset of the plurality of through openings, exclusive of and alternating with, the first subset of the plurality of through holes to create a localized liquid flow aligned with the array of extended fins between adjacent nozzle openings aligned with the array of extended fins that disrupt a thermal boundary layer at the second surface of the cold plate.

10. The cold plate assembly of claim 9, further comprising a return port plate positioned as a second layer stacked on the nozzle plate and having more than one supply flow paths that channel supply liquid from the supply manifold system to the first subset of the plurality of through holes in the nozzle plate and having one or more return flow paths, adjacent to a respective supply flow path, that channel exhaust liquid from the second subset of the plurality of through holes that function as return orifices to the return manifold system.

11. The cold plate assembly of claim 9, further comprising a restrictor plate positionable between the second surface of the cold plate and the nozzle plate to block a third subset of the nozzle through holes that are not required to liquid cool the heat generating electronic component while leaving respective portions of the first subset and the second subset of the plurality of nozzle through holes unblocked for selective impingement of the cooling liquid on higher heat emitting surface areas of the heat generating electronic component.

12. The cold plate assembly of claim 9, wherein:

the first and a second subsets of through holes of the nozzle plate comprise alternating parallel rows of through holes; and the return port plate comprises a baffle of alternating supply and return flow paths aligned with respective rows of nozzle through holes that are respectively in fluid communication with the supply manifold system and the return manifold system.

13. The cold plate assembly of claim 1, wherein:

the array of extended fins presents a plurality of microchannels between each adjacent pair of fins; and the DIRM comprises:

the intake manifold comprising a top plate that extends over the array of extended fins and having a first sequence of nozzle openings presenting a single nozzle opening above each microchannel of the plurality of microchannels, the single nozzle opening presenting a jet of cooling liquid impinging a first section of the second surface along a corresponding microchannel;

an arrangement of alternating upper and lower baffles extending beneath the top plate and positioned laterally inside each microchannel to cause alternating upwards and downwards flow of the cooling liquid impinging at the first section within the microchannel, each downwards flow causing the cooling liquid to impinge a next section of the second surface within the microchannel, each impingement of the cooling liquid on sections of the microchannel resulting in an increased liquid heat transfer coefficient at the second surface; and a bifurcated return manifold having a first and a second return channel at opposed ends of the microchannels along the array of extended fins for collecting and channeling the exhaust cooling liquid flow flowing from each microchannel towards the exhaust port.

14. The cold plate assembly of claim 13, wherein the arrangement of alternating upper and lower baffles comprises:

a row of upper baffles extending downwards from the top plate partially into the microchannels toward the second surface, the row of upper baffles positioned laterally to the microchannel and causing cooling liquid to flow from a top section of the top plate and upper baffle downwards to impinge the second surface of the cold plate within the microchannel; and an alternating row of lower baffles positioned to extend upwards between adjacent extended fins and redirect the impinging downward flow of cooling liquid upwards towards the top plate;

wherein respective spaces presented below the upper baffles and above the lower baffles enabling cooling liquid flow along the microchannel towards each section of the bifurcated return manifold, with multiple direct impingement of the second surface by the cooling liquid.

15. The cold plate assembly of claim 13, wherein the first sequence of nozzle openings are presented within an elongate slot running orthogonal to the array of extended fins.

16. The cold plate assembly of claim 15, wherein:

the elongate slot is positioned substantially at a midpoint above the array of extended fins to generate first and second cooling liquid flows in opposite directions along the microchannels of the array of extended fins; and the arrangement of alternating upper and lower baffles comprises a first section of upper and lower baffles located along a first segment of the microchannels on a first side of the nozzle opening and a second section of upper and lower baffles along a second segment of the microchannels on an opposed, second side of the nozzle opening.

17. An information processing system comprising:

at least one heat generating electronic component; and a cold plate assembly comprising:

a cold plate comprised of a thermally conductive material and having a first surface attachable to a heat generating electronic component among the at least one heat generating electronic component and a second surface opposite to the first surface configured with an array of extended fins facilitating heat transfer from the attached heat generating electronic component via a cooling liquid flow;

an encapsulating lid attachable to the second surface to form a liquid cooling cavity and comprising: (i) an intake port for receiving cooling liquid flow from a cooling liquid source; and (ii) an exhaust port for expelling exhaust cooling liquid provided from impingements of the received cooling liquid on the second surface of the cold plate; and a distributed impingement and recovery manifold (DIRM) positioned within the liquid cooling cavity of the encapsulating lid above the second surface of the cold plate, the DIRM comprising: (i) an intake manifold presenting at least one sequence of nozzle openings in fluid communication with the intake port, each nozzle opening providing direct impingement of a portion of cooling liquid on at least one corresponding section of the second surface; (ii) a return manifold in fluid communication with the exhaust port and which facilitates a return of exhaust cooling liquid to the exhaust port following at least one direct impingement of the portion of cooling liquid onto the at least one corresponding section to provide distributed, localized impingement cooling at corresponding sections of the cold plate; (iii) a nozzle plate positioned as a first layer proximate and parallel to the second surface and having a plurality of through holes; (iv) a supply manifold system sealably connected for liquid transfer from the intake port to a first subset of the through holes in the nozzle plate configured to create a corresponding plurality of nozzle jets that impinges the array of extended fins; and (v) a return manifold system sealably connected for liquid transfer to the exhaust port from a second subset of the plurality of through holes, exclusive of and alternating with, the first subset of the plurality of through holes to create a localized liquid flow aligned with the array of extended fins between adjacent through holes aligned with the array of extended fins that disrupt a thermal boundary layer at the second surface of the cold plate.

18. The information processing system of claim 17, wherein the DIRM further comprises a return port plate positioned as a second layer stacked on the nozzle plate and having more than one supply flow paths that channel supply liquid from the supply manifold system to the first subset of the plurality of through holes in the nozzle plate and having one or more return flow paths, adjacent to a respective supply flow path, that channel exhaust liquid from the second subset of the plurality of through holes that function as return orifices to the return manifold system.

19. The information processing system of claim 17, wherein the cold plate assembly further comprises a restrictor plate positionable between the second surface of the cold plate and the nozzle plate to block a third subset of the nozzle through holes that are not required to liquid cool the heat generating electronic component while leaving respective portions of the first subset and the second subset of the plurality of nozzle through holes unblocked for selective impingement of the cooling liquid on higher heat emitting surface areas of the heat generating electronic component.

20. The information processing system of claim 17, wherein:

the first and the second subsets of through holes of the nozzle plate comprise alternating parallel rows of through holes; and the return port plate comprises a baffle of alternating supply and return flow paths aligned with respective rows of nozzle through holes that are respectively in fluid communication with the supply manifold system and the return manifold system.

21. The information processing system of claim 20, wherein one of the supply and return flow paths of the return port plate comprises downwardly open channels that sealably contact the nozzle plate on each side of a corresponding at least one first row of the nozzle through holes of the nozzle plate, contact portions of the return port plate adjacent to the downwardly open channel configured to sealably contact around a corresponding at least one second row of the nozzle through holes of the nozzle plate, the contact portions having one or more openings aligned with the second row of the nozzle through holes to fluidly communicate with the liquid cooling cavity under the encapsulating lid.

22. The information processing system of claim 17, wherein at least one of: (i) the second surface of the cold plate; (ii) the liquid cooling cavity of the encapsulating lid;

(iii) the nozzle plate; and (iv) the return port plate is coated with at least one material that is one or more of hydrophobic, non-conductive, and anti-corrosive to enable use of facility water as a cooling liquid.

23. The information processing system of claim 17, wherein the DIRM comprises:

an intake manifold comprising a top plate that extends over the array of extended fins and having a first sequence of nozzle openings presenting a single nozzle opening above each microchannel of a plurality of microchannels, the single nozzle opening presenting a jet of cooling liquid impinging a first section of the second surface along a corresponding microchannel;

an arrangement of alternating upper and lower baffles extending beneath the top plate and positioned laterally inside each microchannel to cause alternating upwards and downwards flow of the cooling liquid impinging at the first section within the microchannel, each downwards flow causing the cooling liquid to impinge a next section of the second surface within the microchannel, each impingement of the cooling liquid on sections of the microchannel resulting in an increased liquid heat transfer coefficient at the second surface; and a bifurcated return manifold having a first and a second return channel at opposed ends of the microchannels along the array of extended fins for collecting and channeling the exhaust cooling liquid flow flowing from each microchannel towards the exhaust port.

24. A data center comprising:

an information processing system rack comprising:

an information processing system comprising:

at least one heat generating electronic component; and a cold plate assembly comprising:

a cold plate comprised of a thermally conductive material and having a first surface attachable to a heat generating electronic component among the at least one heat generating electronic component and a second surface opposite to the first surface configured with an array of extended fins facilitating heat transfer from the attached heat generating electronic component via a cooling liquid flow;

an encapsulating lid attachable to the second surface to form a liquid cooling cavity and comprising: (i) an intake port for receiving cooling liquid flow from a cooling liquid source; and (ii) an exhaust port for expelling exhaust cooling liquid provided from impingements of the received cooling liquid on the second surface of the cold plate; and a distributed impingement and recovery manifold (DIRM) positioned within the liquid cooling cavity of the encapsulating lid above the second surface of the cold plate, the DIRM comprising: (i) an intake manifold presenting at least one sequence of nozzle openings in fluid communication with the intake port, each nozzle opening providing direct impingement of a portion of cooling liquid on at least one corresponding section of the second surface; (ii) a return manifold in fluid communication with the exhaust port and which facilitates a return of exhaust cooling liquid to the exhaust port following at least one direct impingement of the portion of cooling liquid onto the at least one corresponding section to provide distributed, localized impingement cooling at corresponding sections of the cold plate; (iii) a nozzle plate positioned as a first layer proximate and parallel to the second surface and having a plurality of through holes; (iv) a supply manifold system sealably connected for liquid transfer from the intake port to a first subset of the through holes in the nozzle plate configured to create a corresponding plurality of nozzle jets that impinges the array of extended fins; and (v) a return manifold system sealably connected for liquid transfer to the exhaust port from a second subset of the plurality of through holes, exclusive of and alternating with, the first subset of the plurality of through holes to create a localized liquid flow aligned with the array of extended fins between adjacent through holes aligned with the array of extended fins that disrupt a thermal boundary layer at the second surface of the cold plate.

25. The data center of claim 24, further comprising:

a facility source of facility-grade cooling liquid, the facility source comprising a facility outlet port and a facility return port; and a liquid distribution system sealably connected between the intake port of the cold plate assembly and an outlet port of the facility source to channel unheated facility water to the cold plate assembly and between the exhaust port of the cold plate assembly and the facility return port to channel heated exhaust water from the cold plate assembly to the facility return port.

26. The data center of claim 25, wherein the liquid distribution system comprises:

a rack liquid cooling manifold system comprising:

a supply manifold comprising a supply control valve and a manifold intake port available for sealably coupling to a facility water supply to receive a cooling liquid and comprising more than one server supply ports each available for sealably coupling, for liquid transfer of the cooling liquid, to a respective cooling liquid supply input of an information processing system node supported by a rack frame of the information processing system rack capable of supporting multiple information processing system nodes, each having one or more heat generating electronic components; and a return manifold comprising a facility water return port for sealably coupling to a facility return to exhaust the cooling liquid and comprising more than one server return ports, each available for sealably coupling, for exhaust liquid transfer, to a respective cooling liquid exhaust output of the corresponding information processing system node, the respective cooling liquid exhaust output and a paired supply liquid cooling input directing cooling liquid flow through one or more similar cold plate assembly to the cold plate assembly positioned within the corresponding information processing system node to thermally cool the one or more heat generating electronic components.

27. The data center of claim 26, wherein the liquid distribution system further comprises a plurality of conduits that sealably couple for liquid transfer: (i) the more than one server supply ports of the supply manifold to the corresponding server supply inputs of the more than one information processing system nodes; (ii) the corresponding server supply input to the one or more cold plate assemblies in the corresponding information processing system node; (iii) the one or more cold plate assemblies in the corresponding information processing system node to the corresponding server return output; and (iv) and the more than one server return outputs to the server return ports of the return manifold.

28. A method of manufacturing a cold plate assembly for providing liquid cooling of heat generating electronic components, the method comprising:

providing a cold plate comprised of a thermally conductive material and having a first surface attachable to a heat generating electronic component among at least one heat generating electronic component and a second surface opposite to the first surface configured with an array of extended fins facilitating heat transfer from the attached heat generating electronic component via a cooling liquid flow, the first surface being a thermal energy receiving surface and the second surface being a thermal energy transferring surface;

placing a distributed impingement and recovery manifold (DIRM) above the second surface of the cold plate, the DIRM comprising: (i) an intake manifold presenting at least one sequence of nozzle openings in fluid communication with a cooling liquid intake port, each nozzle opening providing direct impingement of a portion of cooling liquid on at least one corresponding section of the second surface; (ii) a return manifold in fluid communication with an exhaust port and which facilitates a return of exhaust cooling liquid to the exhaust port following at least one direct impingement of the portion of cooling liquid onto the at least one corresponding section to provide localized impingement cooling at the at least one corresponding section of the cold plate; and a nozzle plate positioned as a first layer proximate and parallel to the second surface and having a plurality of through holes;

positioning a return port plate as a second layer stacked on the first layer, the return port plate having more than one supply flow paths that channel supply liquid from the intake port to a first subset of the plurality of through holes in the nozzle plate that function as nozzle orifices and having one or more return flow paths, adjacent to a respective supply flow path, that channel exhaust liquid from a second subset of the plurality of through holes that function as return orifices to the exhaust port, the second subset being exclusive of the first subset, with one or more nozzle orifices being located proximate to one or more return orifices creating localized cooling flow paths with localized recovery of the cooling liquid that disrupt a thermal boundary layer at the second surface of the cold plate; and sealably attaching an encapsulating lid to the second surface of the cold plate to form a liquid cooling cavity encompassing the DIRM and the array of fins, the encapsulating lid comprising (i) an intake port for receiving cooling liquid flow from a cooling liquid source, the intake port in fluid communication with the intake manifold; and (ii) an exhaust port for expelling exhaust cooling liquid provided from impingements of the received cooling liquid on the second surface of the cold plate, the exhaust port in fluid communication with the return manifold.

29. The method of claim 28, further comprising positioning a restrictor plate between the second surface of the cold plate and the nozzle plate to block a third subset of the nozzle holes that are not required to liquid cool the cold plate while leaving other nozzle holes unblocked for selective impingement of the cooling liquid on higher heat emitting surface areas of the heat generating electronic component.

30. The method of claim 28, wherein:

the nozzle plate comprises parallel rows of nozzle holes;

the return port plate comprises a baffle of alternating supply and return flow paths; and the encapsulating lid comprises an intake manifold separated from a return manifold by the return port plate, the intake manifold in fluid communication with the supply flow paths and with the intake port, and the return manifold in fluid communication with the return flow paths and with the exhaust port.

31. The method of claim 28, further comprising configuring adjacent pairings of nozzle and return ports to create localized cooling flow paths proximate to the second surface of the cold plate to disrupt a thermal boundary layer of the cooling liquid proximate to the cold plate.

32. The method of claim 28, further comprising coating at least one of: (i) the second surface of the cold plate; (ii) the liquid cooling cavity of the encapsulating lid; (iii) the nozzle plate; and (iv) the return port plate with at least one material that is one or more of hydrophobic, non-conductive, and anti-corrosive to enable use of facility water as a cooling liquid.

33. The method of claim 28, further comprising attaching the heat generating electronic component to the first surface of the cold plate for heat transfer away from the heat generating electronic component to the second surface of the cold plate.

34. The method of claim 33, further comprising, prior to attaching the heat generating electronic component to the first surface of the cold plate, positioning a two-dimensional vapor chamber between the heat generating electronic component and the cold plate.

35. The method of claim 28, wherein placing the DIRM comprises:

provisioning a DIRM comprising:

an intake manifold comprising a top plate that extends over the array of extended fins and having a first sequence of nozzle openings presenting a single nozzle opening above each microchannel of a plurality of microchannels, the single nozzle opening presenting a jet of cooling liquid impinging a first section of the second surface along a corresponding microchannel;

an arrangement of alternating upper and lower baffles extending beneath the top plate and positioned laterally inside each microchannel to cause alternating upwards and downwards flow of the cooling liquid impinging at the first section within the microchannel, each downwards flow causing the cooling liquid to impinge a next section of the second surface within the microchannel, each impingement of the cooling liquid on sections of the microchannel resulting in an increased liquid heat transfer coefficient at the second surface; and a bifurcated return manifold having a first and a second return channel at opposed ends of the microchannels along the array of extended fins for collecting and channeling the exhaust cooling liquid flow flowing from each microchannel towards the exhaust port.

* * * * *